(12) United States Patent
Pileggi et al.

(10) Patent No.: US 8,400,066 B1
(45) Date of Patent: Mar. 19, 2013

(54) MAGNETIC LOGIC CIRCUITS AND SYSTEMS INCORPORATING SAME

(76) Inventors: Lawrence T. Pileggi, Pittsburgh, PA (US); Jian-Gang (Jimmy) Zhu, Pittsburgh, PA (US)

(*) Notice: Subject to any disclaimer, the term of this patent is extended or adjusted under 35 U.S.C. 154(b) by 0 days.

(21) Appl. No.: 12/849,595

(22) Filed: Aug. 3, 2010

Related U.S. Application Data

(60) Provisional application No. 61/369,743, filed on Aug. 1, 2010.

(51) Int. Cl.
*H05B 37/02* (2006.01)
(52) U.S. Cl. .......................... 315/152; 315/158
(58) Field of Classification Search .................. None
See application file for complete search history.

(56) References Cited

U.S. PATENT DOCUMENTS

| | | | |
|---|---|---|---|
| 4,967,068 A * | 10/1990 | Lentine et al. | 250/214 LS |
| 6,034,887 A * | 3/2000 | Gupta et al. | 365/171 |
| 6,343,032 B1 | 1/2002 | Black | |
| 6,894,921 B2 * | 5/2005 | Bangert | 365/158 |
| 7,209,381 B2 | 4/2007 | Johnson | |
| 7,212,026 B2 | 5/2007 | Bourianoff | |
| 7,336,525 B2 | 2/2008 | Fujita | |
| 7,518,897 B2 | 4/2009 | Nozieres | |
| 7,728,622 B2 | 6/2010 | Chua-Eoan | |
| 2005/0280058 A1* | 12/2005 | Pakala et al. | 257/295 |
| 2007/0290717 A1 | 12/2007 | Bangert | |
| 2008/0205110 A1 | 8/2008 | Boeve | |
| 2008/0278998 A1 | 11/2008 | Cowburn | |
| 2008/0291584 A1 | 11/2008 | Parkin | |
| 2009/0135526 A1 | 5/2009 | Dieny | |
| 2009/0179667 A1 | 7/2009 | Sugiyama | |
| 2009/0213632 A1 | 8/2009 | Nozieres | |
| 2009/0243653 A1 | 10/2009 | Inokuchi | |
| 2009/0251957 A1 | 10/2009 | Javerliac | |
| 2009/0290268 A1 | 11/2009 | Xi | |
| 2009/0290408 A1 | 11/2009 | Lou | |
| 2009/0290413 A1 | 11/2009 | Prejbeanu | |
| 2009/0316476 A1 | 12/2009 | Javerliac | |
| 2010/0039136 A1 | 2/2010 | Chua-Eoan | |
| 2010/0090262 A1 | 4/2010 | Saito | |
| 2010/0103730 A1 | 4/2010 | Shin | |
| 2010/0110744 A1 | 5/2010 | El Baraji | |
| 2010/0225350 A1 | 9/2010 | Hoeink | |
| 2010/0232219 A1 | 9/2010 | Gibson | |

(Continued)

FOREIGN PATENT DOCUMENTS

| | | |
|---|---|---|
| JP | 2006-32915 | 2/2008 |
| JP | 2008-60905 | 3/2008 |

(Continued)

OTHER PUBLICATIONS

S. Bandyopadhyay, et al., "Electron spin for classical information processing: a brief survey of spin-based logic devices, gates and circuits," Nanotechnology, v. 20 (2009), pp. 1-35.

(Continued)

*Primary Examiner* — Crystal L Hammond
(74) *Attorney, Agent, or Firm* — David Garrod

(57) ABSTRACT

Logic circuits based, at least in part, on use of spin-torque transfer (STT) to switch the magnetization—and hence the logic state—of a magnetic material are disclosed. Aspects of the invention include novel STT-based switching devices, new configurations of known STT-based devices into useful logic circuits, common logic circuits and system building blocks based on these new devices and configurations, as well as methods for inexpensively mass-producing such devices and circuits.

31 Claims, 25 Drawing Sheets

U.S. PATENT DOCUMENTS

| | | |
|---|---|---|
| 2010/0240152 A1 | 9/2010 | Wang |
| 2010/0308378 A1 | 12/2010 | Song |
| 2010/0315123 A1 | 12/2010 | Niemier |
| 2011/0068825 A1 | 3/2011 | Xi |
| 2011/0069536 A1 | 3/2011 | Lou |
| 2011/0115522 A1 | 5/2011 | Javerliac |
| 2011/0141803 A1 | 6/2011 | Kim |
| 2011/0147816 A1 | 6/2011 | Nikonov |
| 2011/0148458 A1 | 6/2011 | Sugibayashi |
| 2011/0149647 A1 | 6/2011 | Kim |
| 2011/0163743 A1 | 7/2011 | Rodmacq |

FOREIGN PATENT DOCUMENTS

| | | |
|---|---|---|
| JP | 2009-177306 | 8/2009 |
| JP | 2010-3850 | 1/2010 |
| KR | 10-2009-0105132 | 10/2009 |
| RU | 2-367-059 C1 | 9/2009 |
| WO | 2009-011484 | 1/2009 |
| WO | 2009-021006 | 2/2009 |
| WO | 2009-104851 | 8/2009 |
| WO | 2009-158274 | 12/2009 |
| WO | 2010-019881 | 2/2010 |
| WO | WO 2011053182 | 5/2011 |
| WO | WO 2011087120 | 7/2011 |

OTHER PUBLICATIONS

B. Behin-Aein, et al., "Proposal for an all-spin logic device with built-in memory," Nature Nanotechnology, vol. 5 (2010), pp. 266-270.

D. A. Allwood, et al., "Magnetic domain-wall logic," Science, v. 309 (2005), pp. 1688-1692.

C. Chappert, et al., "The emergence of spin electronics in data storage," Nature Materials, v. 6 (2007), pp. 813-823.

B. Dieny, et al., "Spin-transfer effect and its use in spintronic components," Int. J. of Nanotechnology, vol. 7, Nos. 4/5/6/7/8 (2010), pp. 591-614.

S. Fukami, et al., "Low-Current Perpendicular Domain Wall Motion Cell for Scalable High-Speed MRAM," 2009 Symposium on VLSI Technology Digest of Technical Papers, pp. 230-231.

X. F. Han, et al., "Nano-Scale Patterned Magnetic Tunnel Junction and Its Device Applications," AAPPS Bulletin, v. 18, n. 6 (2008), pp. 24-32.

R. K. Kawakami, et al., "Fundamentals of Spintronics in Metal and Semiconductor Systems," in A. Korkin and F. Rosei (eds.), Nanoelectronics and Photonics, Springer (2008), pp. 59-114.

C. Pampuch, et al., "Programmable magnetologic full adder," Applied Physics A, v. 79 (2004), pp. 415-416.

G. Reiss, et al., "Magnetic Tunnel Junctions," Springer (2007), pp. 291-333.

J. Shen, "Logic Devices and Circuits Based on Giant Magnetoresistance," IEEE Trans. on Magnetics, v. 33, n. 6 (1997), pp. 492-497.

P. Xu, et al., "An all-metallic logic gate based on current-driven domain wall motion," Nature Nanotechnology, v. 3 (2008).

M. Yamanouchi, et al., "Current-induced domain-wall switching in a ferromagnetic semiconductor structure," Nature, v. 428 (2004), pp. 539-542.

H. Zabel, "Progress in spintronics," Superlattices and Microstructures, v. 46 (2009), pp. 541-553.

W. Zhao, et al., "New non-volatile logic based on spin-MTJ," Physica Status Solidi (a), v. 205, n. 6 (2008), pp. 1373-1377.

J.-G. Zhu, "Magnetoresistive Random Access Memory: The Path to Competitiveness and Scalability," Proceedings of the IEEE, vol. 96, 11, pp. 1786-1798 (2008).

J.-G. Zhu, "MRAM: Path to Low Power and Scalability," Lecture to IEEE San Jose chapter.

J.-G. Zhu, Guest Lecture (2009).

* cited by examiner

Proposed Schematic Symbol

MAGNETIC LOGIC CIRCUITS AND SYSTEMS INCORPORATING SAME

CROSS-REFERENCE TO RELATED APPLICATION

This application claims priority from U.S. Provisional Applic. Ser. No. 61/369,743, entitled "Magnetic Logic Circuits, Integration and Fabrication of Same," and filed Aug. 1, 2010 by the present inventors. The '743 applic. is incorporated by reference herein.

FIELD OF THE INVENTION

The invention relates generally to logic circuits based, at least in part, on use of spin-torque transfer (STT) to switch the magnetization—and hence the logic state—of a magnetic material. Aspects of the invention disclosed herein include novel STT-based switching devices, new configurations of known STT-based devices into useful logic circuits, common logic circuits and system building blocks based on these new devices and configurations, as well as methods for inexpensively mass-producing such devices and circuits.

BACKGROUND

For decades, the semiconductor industry has been driven by the tenacious pursuit to double the number of components on a single die every two years. Motivated by simple economics, this unrelenting pursuit of density scaling fueled the exponential growth of the industry. As technology continues to scale, however, it is apparent that power dissipation and density limits are already slowing further improvements with CMOS, and the cost of full-custom design and manufacturing is becoming prohibitive. While there are various post-CMOS technology candidates, it is likely that future integrated systems will be based on a myriad of technologies that are packaged and/or stacked together. The combination of circuits and technologies will be determined by the target application, cost, and required performance.

Nanoscale magnetic devices, such as STT memory devices [see J.-G. Zhu, "Magnetoresistive Random Access Memory: The Path to Competitiveness and Scalability," (Invited Paper) Proceedings of the IEEE, vol. 96, 11, pp. 1786-1798 (2008)], are particularly promising devices for on-chip non-volatile storage. These devices can provide a "disk-like" storage capability for an integrated system while operating at low power levels.

Various attempts and ideas appear in the prior art regarding the possibility of using spin-based magnetic devices as logic switching devices. See e.g., the following references:

1. S. Bandyopadhyay, et al., "Electron spin for classical information processing: a brief survey of spin-based logic devices, gates and circuits," Nanotechnology, v. 20 (2009), pp. 1-35.
2. B. Behin-Aein, et al., "Proposal for an all-spin logic device with built-in memory," Nature Nanotechnology, vol. 5 (2010), pp. 266-270.
3. D. A. Allwood, et al., "Magnetic domain-wall logic," Science, v. 309 (2005), pp. 1688-1692.
4. C. Chappert, et al., "The emergence of spin electronics in data storage," Nature Materials, v. 6 (2007), pp. 813-823.
5. B. Dieny, et al., "Spin-transfer effect and its use in spintronic components," Int. J. of Nanotechnology, Vol. 7, Nos. 4/5/6/7/8 (2010), pp. 591-614.
6. S. Fukami, et al., "Low-Current Perpendicular Domain Wall Motion Cell for Scalable High-Speed MRAM," 2009 Symposium on VLSI Technology Digest of Technical Papers, pp. 230-31.
7. X. F. Han, et al., "Nano-Scale Patterned Magnetic Tunnel Junction and Its Device Applications," AAPPS Bulletin, v. 18, n. 6 (2008), pp. 24-32.
8. R. K. Kawakami, et al., "Fundamentals of Spintronics in Metal and Semiconductor Systems," in A. Korkin and F. Rosei (eds.), Nanoelectronics and Photonics, Springer (2008), pp. 59-114.
9. J.-P. Nozieres, et al., U.S. Pat. No. 7,518,897 B2, "System and method for providing content-addressable magnetoresistive random access memory cells," (2009).
10. C. Pampuch, et al., "Programmable magnetologic full adder," Applied Physics A, v. 79 (2004), pp. 415-16.
11. G. Reiss, et al., "Magnetic Tunnel Junctions," Springer (2007), pp. 291-333.
12. M. B. Johnson, U.S. Pat. No. 7,209,381 B2, "Signal Processing Device with Disparate Magnetoelectronic Gates" (2007).
13. J. Shen, "Logic Devices and Circuits Based on Giant Magnetoresistance," IEEE Trans. on Magnetics, v. 33, n. 6 (1997), pp. 492-97.
14. H. Shin, PCT Pat. App. No. WO 2009/011,484 A1, "Magnetic Memory Cell."
15. H. Shin, et al., PCT Pat. App. No. WO 2009/104851 A1, "Device for XOR Magneto-Logic Circuit using STT-MTJ."
16. L. G. Chua-Eoan, PCT Pat. App. No. WO 2010/019881 A1, "Gate Level Reconfigurable Magnetic Logic."
17. P. Xu, et al., "An all-metallic logic gate based on current-driven domain wall motion," Nature Nanotechnology, v. 3 (2008).
18. M. Yamanouchi, et al., "Current-induced domain-wall switching in a ferromagnetic semiconductor structure," Nature, v. 428 (2004), pp. 539-542.
19. H. Zabel, "Progress in spintronics," Superlattices and Microstructures, v. 46 (2009), pp. 541-553.
20. W. Zhao, et al., "New non-volatile logic based on spin-MTJ," Physica Status Solidi (a), v. 205, n. 6 (2008), pp. 1373-77.

These references—which are incorporated for their teachings of various details regarding the physical principles on which aspects of the invention operate, as well as additional descriptions of various structures, elements, materials, and devices useful in the construction or application of various embodiments of the invention, as well as various fabrication techniques suitable for use in fabricating embodiments of the invention, or portions thereof—demonstrate a significant, worldwide effort to develop commercially viable magnetic logic devices over the past decade. Nevertheless, as persons skilled in the art acknowledge, this goal has not yet been achieved. See, e.g., Bandyopadhyay, et al. (2009), p. 32 ("In this review, we have attempted to provide a synopsis of our current understanding of those spin-based logic devices, gates and architectures that have attracted the most attention in the engineering and applied physics community. We have found that no spin-based approach is perfect; all have serious shortcomings."); R. K. Kawakami, et al. (2008), p. 63 ("Finally, spintronics has the possibility to deliver high-speed performance and low power consumption, although one should be cautious about making such blanket statements . . . . To sum up, there is potential for high-speed, low-power applications, but novel circuit architectures need to be developed to bring this to fruition.").

OBJECTS AND SUMMARY OF THE INVENTION

In light of the above, a preferred form of the invention seeks to provide digital logic and finite state machines implemented exclusively, or nearly exclusively, using STT devices, thereby enabling powerful, energy-efficient integrated systems that are otherwise unattainable.

Certain objects of the invention relate to logic circuits formed using the perpendicular MRAM device [of Fukami et al. (2009)], but without the need for semiconductor switches or transistors of any kind. In these embodiments, the inventors identify a previously unrecognized leakage problem (referred to herein as "current sneak paths") and disclose various circuit architectures/techniques to address the problem.

Other objects of the invention relate to a new class of STT-based magnetic switching cells (mCells) that provide electrical isolation between their programming and evaluation paths, thereby avoiding the sneak path problem associated with MRAM-based logic circuits.

Still further objects of the invention relate to different forms of mCell-based (or MRAM-based) logic systems, including passive load (resistive or fixed input mCell) vs. active load (complimentary) forms, and single-ended vs. differential forms.

And still further objects of the invention relate to processes, techniques, apparatus and materials for efficiently mass-producing mCell-based (or MRAM-based) logic systems.

Generally speaking, and without intending to be limiting, a magnetic logic circuit according to certain aspects of the inventive teachings may include: a plurality of mCells, each with (1) first and second programming terminals connected to respective ends of a low-resistance programming path and (2) first and second evaluation terminals connected to respective ends of an evaluation path whose resistance can switch between at least a first, lower-resistance state and a second, higher-resistance state in response to signals magnetically coupled from the programming path. The programming and evaluation paths are preferably, though not necessarily, electrically isolated. At least one of the plural mCells is configured as a logic-driving cell, with one of its evaluation terminals coupled (directly or indirectly through other mCells) to a supply terminal and the other of its evaluation terminals connected to one or more programming terminal(s) of one, two, or more respective fanout-receiving mCells, such that when the logic-driving cell is in its lower-resistance state, current(s) coupled from the supply terminal through the evaluation path of the logic-driving cell and through the programming paths of the fanout-receiving cells set the resistance states of said fanout-receiving cells. The supply terminal is preferably connected to a pulsed supply that provides an alternating sequence of ON and OFF supply states, and the resistance states of the fanout-receiving cells may only be capable of changing when the pulsed supply is in its ON supply state. Preferably, at least one evaluation terminal of each of the fanout-receiving mCells is connected (directly or indirectly) to a second supply terminal, with the second supply terminal connected to a second pulsed supply that provides an alternating sequence of ON and OFF supply states, where the ON supply states of the first and second supplies do not overlap—thereby providing two-phase clocking between the logic-driving mCell(s) and the fanout-receiving mCells. At least one of the logic-driving mCells may form a part of a logic gate with a stack depth of at least four, five or six cells—meaning that the coupling of the logic-driving mCell's evaluation terminal to the supply terminal traverses the evaluation paths of at least three, four or five other mCells in the same stack, and thereby allowing the implementation very complex logic functions in a single stage.

Again, generally speaking, and without intending to be limiting, a magnetic logic circuit according to certain aspects of the inventive teachings may also include complimentary, multi-input magnetic logic circuits comprising, for example, the following: at least first, second, and third logic input terminals, each configured to receive a respective logical input signal; a logic output terminal that (when pulsed or sampled) delivers a logical output signal in response to the logical input signals (from the present or previous clock phase, depending on implementation); a plurality of mCells, each having (1) first and second programming terminals connected to respective ends of a low-resistance programming path and (2) first and second evaluation terminals connected to respective ends of an evaluation path whose resistance can switch between at least a first, lower-resistance state and a second, higher-resistance state in response to signals magnetically coupled from said programming path; a negative supply terminal; and a positive supply terminal. Half of the plural mCells are configured as at least three lower-stack mCells, where each lower-stack mCell has one of its programming terminals connected to receive one of the logical input signals from one of the logic input terminals, and where each lower-stack mCell has one of its evaluation terminals coupled (directly or via the evaluation path(s) of other(s) of the lower-stack mCells) to the negative supply terminal and the other of its evaluation terminals coupled (directly or via the evaluation path(s) of other(s) of the lower-stack mCells) to the logic output terminal. The lower-stack mCells are connected such that (1) logical input signals selected from a first set of logic values enable low-resistance path(s) between the negative supply terminal and the logic output terminal using one or more of the evaluation path(s) of said lower-stack mCells and (2) logical input signals not contained in the first set of logic values disable the low-resistance path(s) between the negative supply terminal and the logic output terminal. The other half of the plural mCells are configured as at least three upper-stack mCells, where each upper-stack mCell has one of its programming terminals connected to receive one of said logical input signals from one of said logic input terminals, and where each upper-stack mCell has one of its evaluation terminals coupled (directly or via the evaluation path(s) of other(s) of the upper-stack mCells) to the positive supply terminal and the other of its evaluation terminals coupled (directly or via the evaluation path(s) of other(s) of the upper-stack mCells) to the logic output terminal. The upper-stack mCells are connected such that (1) logical input signals not contained within the first set of logic values enable low-resistance path(s) between the positive supply terminal and the logic output terminal using one or more of the evaluation path(s) of the upper-stack mCells and (2) logical input signals selected from the first set of logic values disable the low-resistance path(s) between the positive supply terminal and the logic output terminal. Such complimentary magnetic logic circuits may further include (1) a first pulsed supply, connected to the positive supply terminal, the first pulsed supply operating according to an alternating sequence of ON and OFF supply states and supplying a higher voltage during its ON state than during its OFF state, and/or (2) a second pulsed supply, connected to the negative supply terminal, the second pulsed supply also operating according to the alternating sequence of ON and OFF supply states and supplying a lower voltage during its ON state than during its OFF state, thereby causing the resistance states of the mCells to switch only during the ON states of the first and/or second supplies. Such complimentary (or non-complimentary) magnetic logic circuits may implement one of the following logic functions: and-or-invert (AOI); or-and-invert (OAI); multiplex (MUX); and-or (AO); or-and (OA); exclusive or (XOR); not exclusive or (XNOR); or other functions, including complex and very complex functions. In such complimentary implementations, for each mCell (among the lower-stack mCells) that receives a logical input signal at its first programming terminal, there exists a corresponding complimentary mCell (among the upper-stack mCells) that receives the same logical input signal at its second programming terminal, and for each mCell (among the lower-stack mCells) that receives a logical input signal at its second programming terminal, there exists a corresponding complimentary mCell (among the upper-stack mCells) that receives the same logical input signal at its first programming terminal. In single-ended embodiments, each mCell programming input that does not receive a logical input signal is preferably connected to an input reference terminal that provides a reference voltage, which is preferably set approximately midway between the highest voltage regularly seen at the positive supply terminal and the lowest voltage regularly seen at the negative supply terminal, and may be continuous or pulsed; alternatively, each mCell programming input that does not receive a logical input signal may connected to the negative or positive supply terminal. Such complimentary logic circuits may be differential, in which case all of the logic input terminals are differential input terminals, each receiving a respective differential logical input signal; the logic output terminal is a differential terminal that delivers a differential logical output signal, with the plurality of mCells (previously described) driving a first node of the differential logic output terminal; and wherein the complimentary logic circuit would further include additional components to drive the differential side of the circuit, as follows: a second plurality of mCells, equal in number to the previously-described plurality of mCells, with the second plurality of mCells allocated equally into respective sets of second lower-stack mCells and second upper-stack mCells. The second lower-stack mCells would have their evaluation terminals connected between the negative supply terminal and a second node of the differential logic output terminal in the same configuration as the previously-described lower-stack mCells, and the second lower-stack mCells would receive the same logical input signals as the previously-described lower-stack mCells, but with the input polarities reversed. The second upper-stack mCells would have their evaluation terminals connected between the positive supply terminal and the second node of the differential logic output terminal in the same configuration as the previously-described upper-stack mCells, with the second upper-stack mCells receiving the same logical input signals as the previously-described upper-stack mCells, but with the input polarities reversed. Such a differential, complimentary circuit would operate such that: (i) when the lower-stack mCells enable low-resistance path(s) between the first node of the differential logic output terminal and the negative supply terminal, the second lower-stack mCells disable any low-resistance path(s) between the second node of the differential logic output terminal and the negative supply terminal; (ii) when the lower-stack mCells disable any low-resistance path(s) between the first node of the differential logic output terminal and the negative supply terminal, the second lower-stack mCells enable low-resistance path(s) between the second node of the differential logic output terminal and the negative supply terminal; (iii) when the upper-stack mCells enable low-resistance path(s) between the first node of the differential logic output terminal and the positive supply terminal, the second upper-stack mCells disable any low-resistance path(s) between the second node of the differential logic output terminal and the positive supply terminal; and (iv) when the upper-stack mCells disable any low-resistance path(s) between the first node of the differential logic output terminal and the positive supply terminal, the second upper-stack mCells enable low-resistance path(s) between the second node of the differential logic output terminal and the positive supply terminal. Such differential logic circuits may also include one, two, three or more fanout-receiving logic circuits, with each of the fanout-receiving logic circuits comprising plural mCells, and with at least one of the mCells receiving the differential logic output signal at its first and second programming terminals. The fanout-receiving logic circuits may of complimentary (active load) configuration, non-complimentary (passive load) configuration, or a combination thereof, and may provide single-ended output(s), differential output(s), or a combination thereof.

Again, generally speaking, and without intending to be limiting, differential logic circuits in accordance with certain aspects of these teachings may include systems comprised of: at least first, second, third and fourth mCells, with each mCell having (1) first and second programming terminals connected to respective ends of a low-resistance programming path and (2) first and second evaluation terminals connected to respective ends of an evaluation path whose resistance can switch between at least a first, lower-resistance state and a second, higher-resistance state in response to signals magnetically coupled from the programming path; the first mCell receiving a first differential logic signal at its first and second programming terminals, respectively; the second mCell receiving (in inverted polarity) the first differential logic signal at its second and first programming terminals, respectively; the third mCell receiving a second differential logic signal at its first and second programming terminals, respectively; and the fourth mCell receiving (in inverted polarity) the second differential logic signal at its second and first programming terminals, respectively; a differential output terminal having positive and negative output nodes; and wherein (1) the first and third mCells have their respective evaluation terminals connected such that, under a first set of input conditions, the evaluation path(s) of those mCell(s) enable one or more low-resistance path(s) between a supply node and the positive node of the differential output terminal, and (2) the second and fourth mCells have their respective evaluation terminals connected such that, under a second set of input conditions, the evaluation path(s) of those mCell(s) enable one or more low-resistance path(s) between the supply node and the negative node of the differential output terminal; whereby (A) under the first set of input conditions, low-resistance path(s) exist between the supply node and the positive node of the differential output terminal, but not the negative node of the differential output terminal, and (B) under the second set of input conditions, low-resistance path(s) exist between the supply node and the negative node of the differential output terminal, but not the positive node of the differential output terminal. Such differential logic circuits may further include a first passive load element connected between the positive node of the differential output terminal and a second supply terminal, and a second passive load element connected between the negative node of the differential output terminal and the second supply terminal. Alternatively, such differential logic circuits may include a first active load circuit, including plural mCells, connected between the positive node of the differential output terminal and a second supply terminal, and a second active load circuit, including plural mCells, connected between the negative node of the differential output terminal and the second supply terminal. Such differential logic circuit preferably include one, two, three, or more fanout-receiving gates, with each fanout-receiving gate comprised of plural mCells, at least one of which has its programming terminals connected to the positive and negative nodes of the differential output terminal.

Still other aspects of the invention relate to magnetic logic circuits and devices, as described above, in combination with other circuitry such as CMOS circuits and/or MRAM storage devices, as well as implementations of the above that can operate using scavenged or intermittent power. The interconnection between the aforementioned magnetic logic circuits and other circuitry can be achieved by interconnecting two chips, stacking and bonding one chip onto another, or by directly integrating the magnetic logic materials onto the other circuitry substrate.

BRIEF DESCRIPTION OF THE DRAWINGS

Aspects of the above—as well as other—objects, features, advantages, and applications of the invention are depicted in the accompanying set of figures, in which.

DESCRIPTION OF ILLUSTRATIVE EMBODIMENTS

Figure 1A:
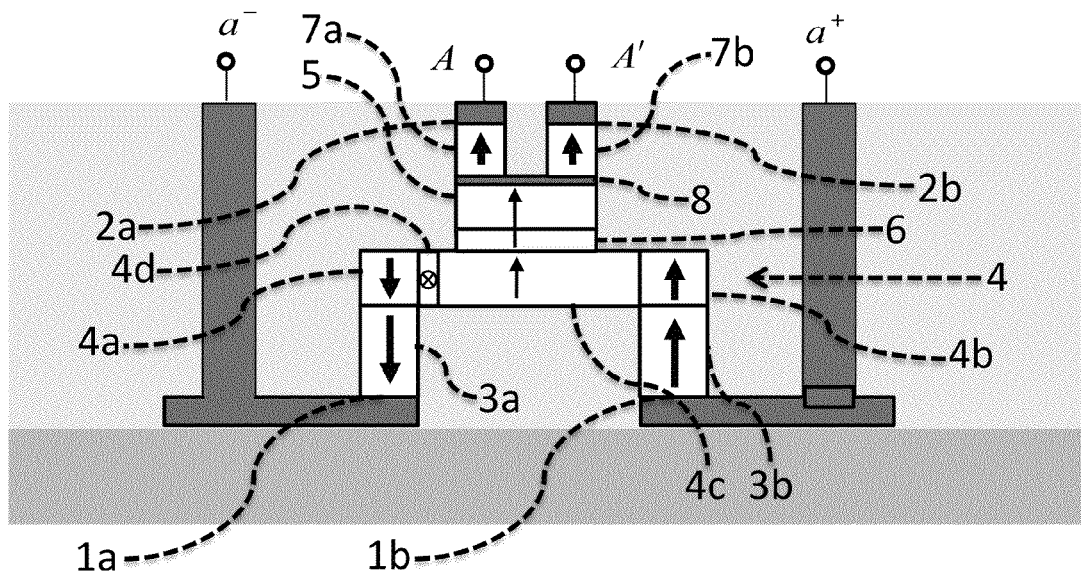
FIGS. 1A-B depict an illustrative magnetic switching cell (mCell) in accordance with the invention in its low- and high-resistance states, respectively.

As previously noted, certain aspects of the instant invention relate to a new magnetic switching cell (mCell) that provides electrical isolation between the current paths used to program—vs. evaluate the state of—the device. Relevant structural and operational features of the inventive mCell are best appreciated with reference to FIGS. 1A-B, which respectively depict an illustrative mCell in its lower-resistance and higher-resistance states. The mCell is a 4-terminal device. As depicted, the mCell includes first and second programming terminals (1a and 1b) that are used to apply currents to switch the mCell between its lower- and higher-resistance states. The mCell also includes first and second evaluation terminals (2a and 2b) that present a first, lower resistance when the mCell is in its lower-resistance state, and a second, higher resistance when the mCell is in its higher-resistance state. [Based on current technology, the terminal-to-terminal resistance in the lower-resistance state is approximately 5000 ohms, whereas the resistance in the higher-resistance state is approximately 15,000 ohms for an mCell device with 20 nm length and width.]

A programming path of the illustrative mCell includes first and second permanently magnetized programming electrodes (3a and 3b). [These electrodes are preferably made of magnetic materials with perpendicular anisotropy, such as Co/Pt, Co/Pd, and Co/Ni, multilayer structured thin films, or Co thin films, CoPt and CoCrPt alloys, MgAl-L1$_0$, CoPt-L1$_0$, and FePt-L1$_0$, atomically ordered thin films, but can alternatively be made of NiFe/IrMn, NiFe/NiMn, NiFe/PtMn, NiFe/NiO, CoFe/IrMn, CoFe/NiMn, CoFe/PtMn, NiFe/NiO.] Programming electrodes (3a-b) are electrically coupled to the respective first and second programming terminals (1a-b). The first programming electrode has a magnetization substantially opposite to that of the second programming electrode (as depicted by the oppositely oriented arrows in boxes 3a-b). The illustrative programming path also includes a magnetic switching layer (4) made from a conductive material with perpendicular magnetic anisotropy. [The preferred material for this layer is FePt or CoPt L1$_0$ ordered film, but it can also be formed from Co/Pt, or Co/Ni, or Co/Pd multilayer structured film.] This magnetic switching layer (4) includes a first region (4a) adjacent to the first programming electrode (3a), a second region (4b) adjacent to the second programming electrode (3b), and a domain switching region (4c) located between the first and second regions (4a-b).

The first region (4a) of the magnetic switching layer is electrically coupled to the first programming electrode (3a) so that current can flow between the first region and the first programming electrode. The first region (4a) is also magnetically coupled to the first programming electrode (3a) so that the magnetization in the first region is pinned by the permanent magnetization of the first programming electrode (this is depicted by the arrows in 4a and 3a, showing that both regions display substantially the same direction of magnetization). Similarly, the second region (4b) of the magnetic switching layer is electrically coupled to the second programming electrode (3b) so that current can flow between the second region and the second programming electrode. The second region (4b) is also magnetically coupled to the second programming electrode (3b) so that the magnetization in the second region is pinned by the permanent magnetization of the second programming electrode (this is depicted by the arrows in 4b and 3b, showing that both regions display substantially the same direction of magnetization).

The pinned, opposing magnetizations in the first and second regions (4a-b) of the magnetic switching layer (4) create a domain wall (4d) in the domain switching region (4c) of the magnetic switching layer. The magnetic switching layer (4) is configured so that currents flowing from the first programming electrode (3a) to the second programming electrode (3b) cause the domain wall (4d) to position itself proximate to the first region (4a) of the magnetic switching layer (4), thereby causing most of the domain switching region (4c) to assume the magnetization of the second region (4b); this causes the mCell to assume its lower-resistance state. Similarly, currents flowing from the second programming electrode (3b) to the first programming electrode (3a) cause the domain wall (4d) to position itself proximate to the second region (4b) of the magnetic switching layer (as depicted in FIG. 1B). This causes most of the domain switching region (4c) to assume the magnetization of the first region (4a), which causes the mCell to assume its higher-resistance state.

Referring again to FIG. 1A, the exemplary mCell also includes an evaluation path that includes a field-switchable magnetic evaluation layer (5). This layer (5) is electrically isolated from the structures that make up the programming path by, for example, an insulating ferromagnetic or ferrimagnetic layer (6). The field-switchable magnetic evaluation layer (5) is also magnetically coupled to the domain switching region (4c) of the magnetic switching layer, such that the magnetization of the field-switchable magnetic evaluation layer follows the magnetization of the domain switching region of the magnetic switching layer (this is illustrated in FIG. 1a, where 5 follows the up magnetization of 4c, and in FIG. 1b, where 5 follows the down magnetization of 4c).

The evaluation path also includes first and (optional) second permanently magnetized evaluation electrodes (7a-b). The first evaluation electrode (7a) is electrically coupled between the first evaluation terminal (2a) and the magnetic evaluation layer (5), and the (optional) second evaluation electrode (7b) is electrically coupled between the second evaluation terminal (2b) and the magnetic evaluation layer (5). At least one magnetic tunnel junction (shown as two junctions created by layer 8 in FIGS. 1a-b) is/are interposed between at least one of the evaluation electrodes (7a-b) and the magnetic evaluation layer (5), so that currents which flow between the evaluation terminals (2a-b) through the magnetic evaluation layer (5) pass through the at least one tunnel junction. [In alternative embodiments, the tunnel junction(s) in the evaluation path can be replaced by one or more nonmagnetic metallic interlayer(s), such as Cu, Cr.]

Figure 1B:
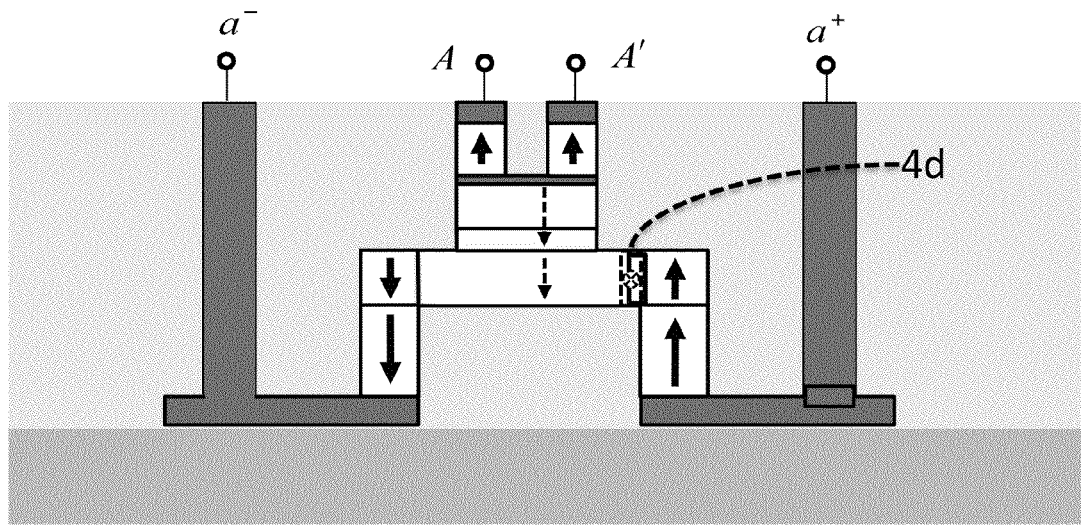
Figure 2A:
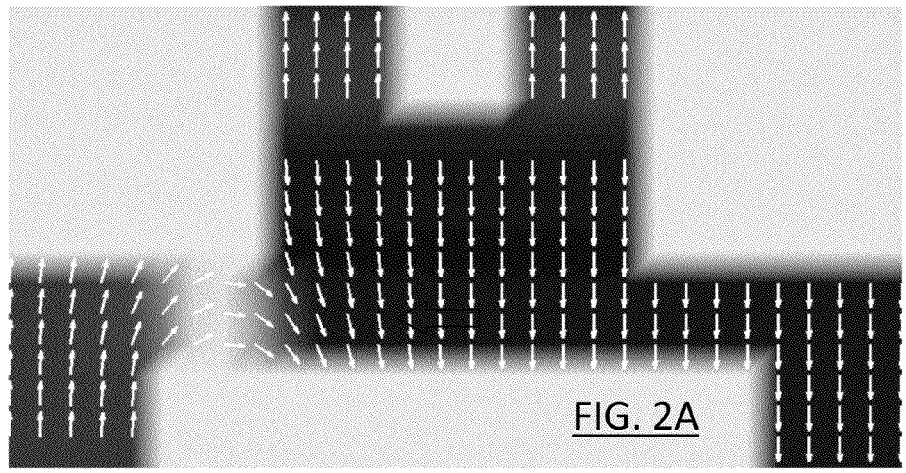
FIGS. 2A-F depict a micro-magnetic simulation of an exemplary mCell device in which a 1 ns (right-to-left) current pulse across the mCell's domain switching layer causes the domain wall to reposition itself proximate to the right-side pinned region, which causes the device to assume its lower-resistance state.
Figure 2B:
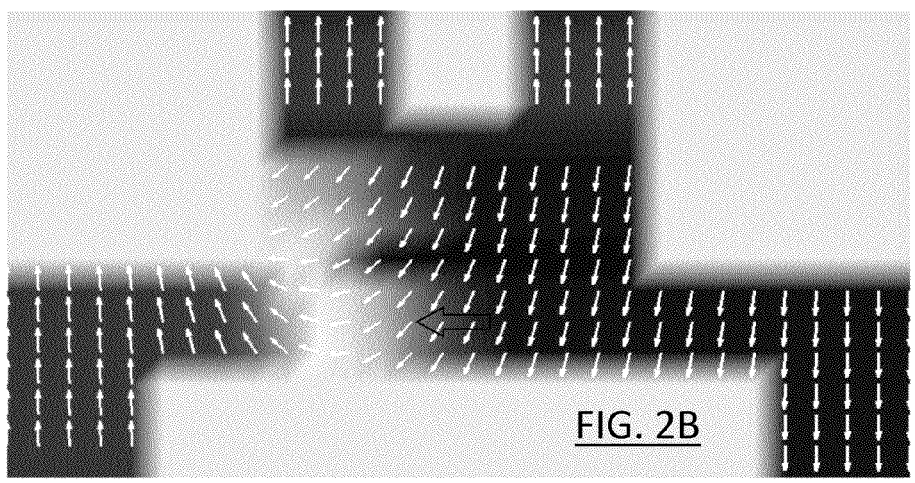
Figure 2C:
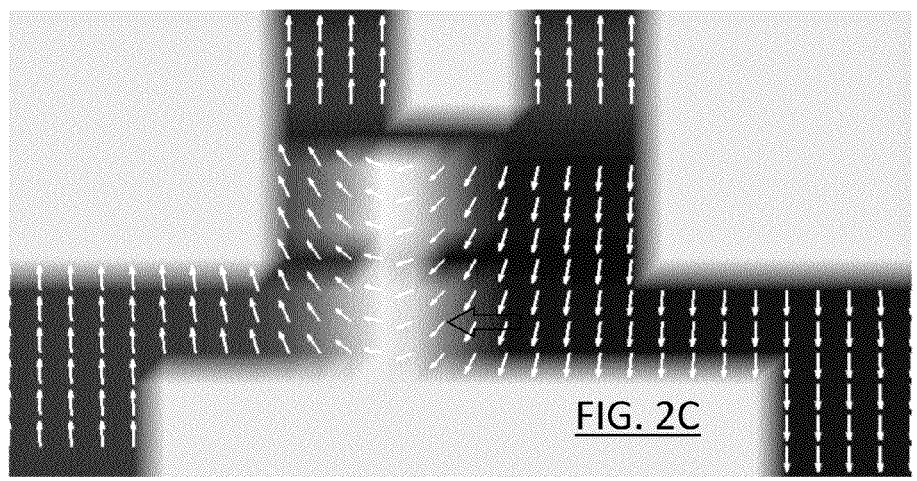
Figure 2D:
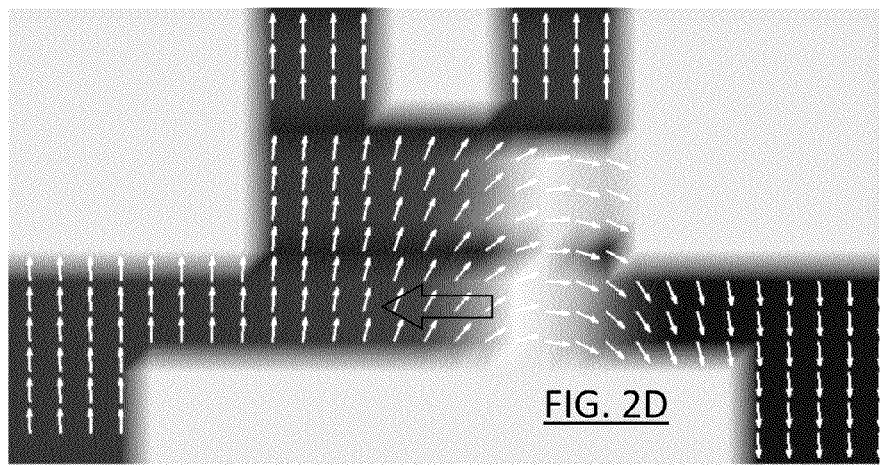
Figure 2E:
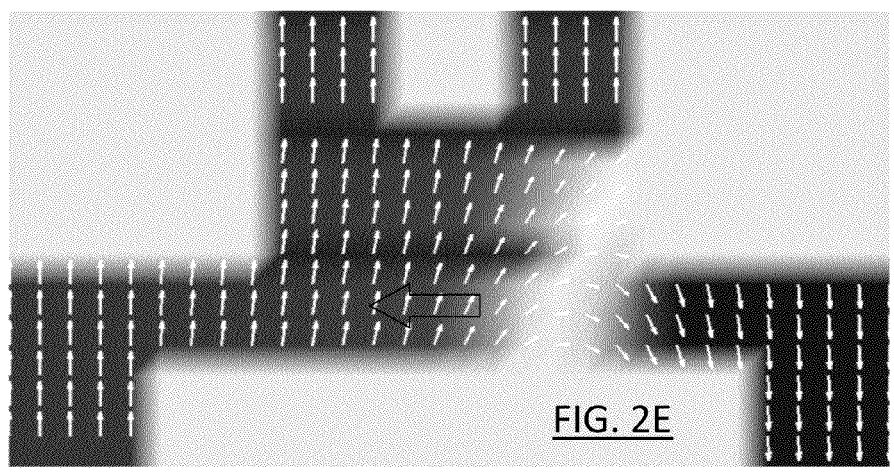
Figure 2F:
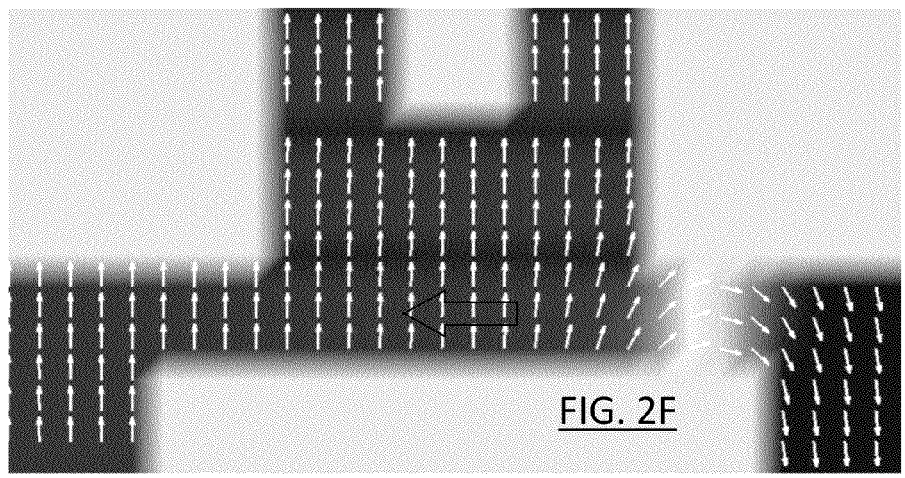
Figure 2G:
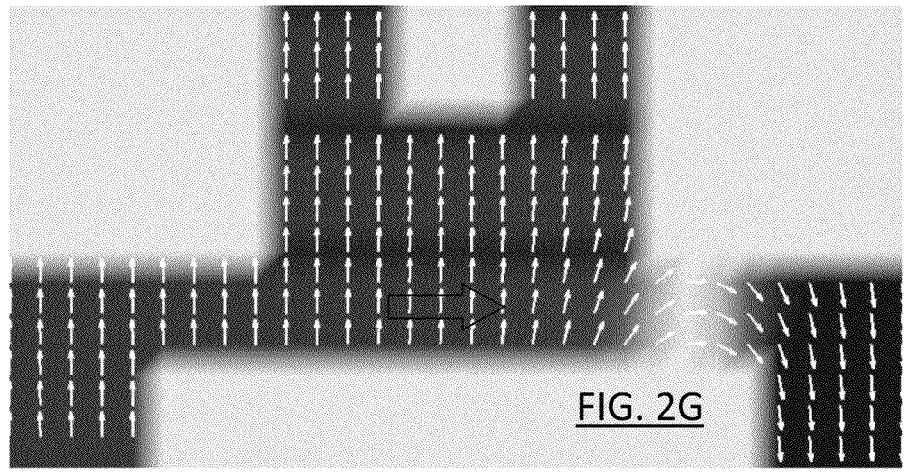
FIGS. 2G-L depict a further micro-magnetic simulation of the exemplary mCell device in which a 1 ns (left-to-right) current pulse across the mCell's domain switching layer causes the domain wall to reposition itself proximate to the left-side pinned region, which causes the device to assume its higher-resistance state.
Figure 2H:
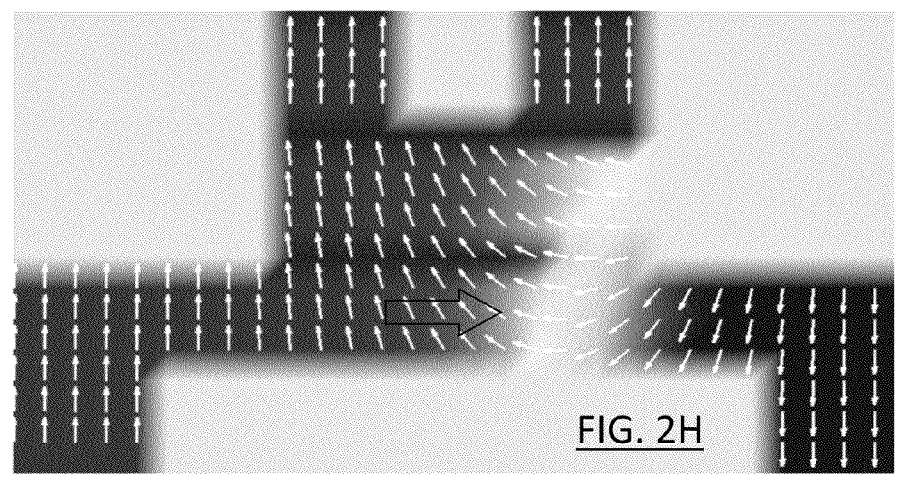
Figure 2I:
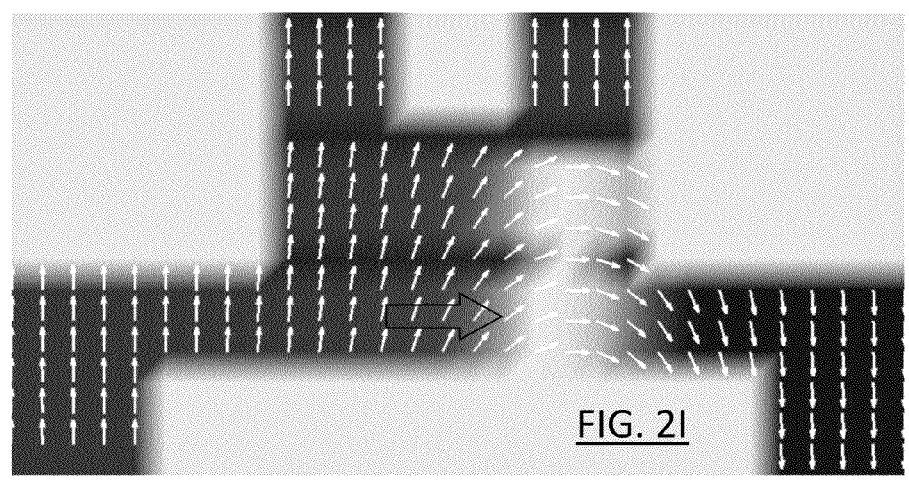
Figure 2J:
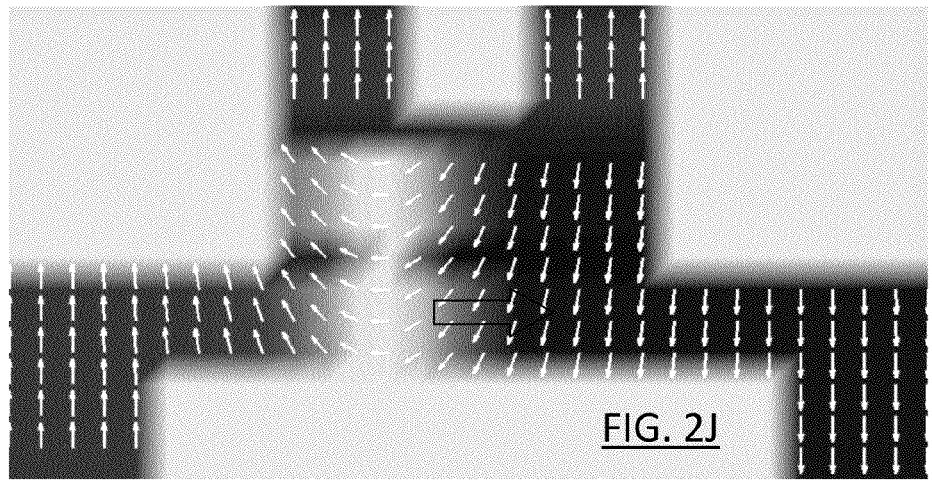
Figure 2K:
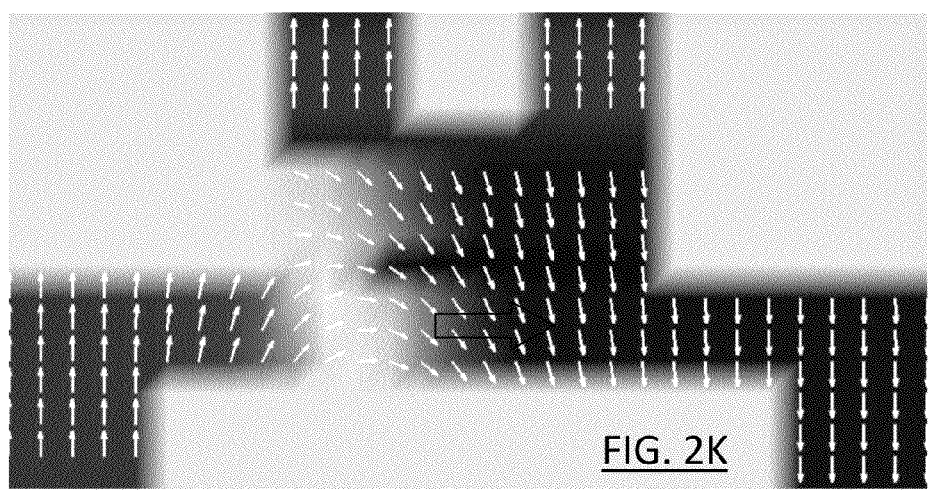
Figure 2L:
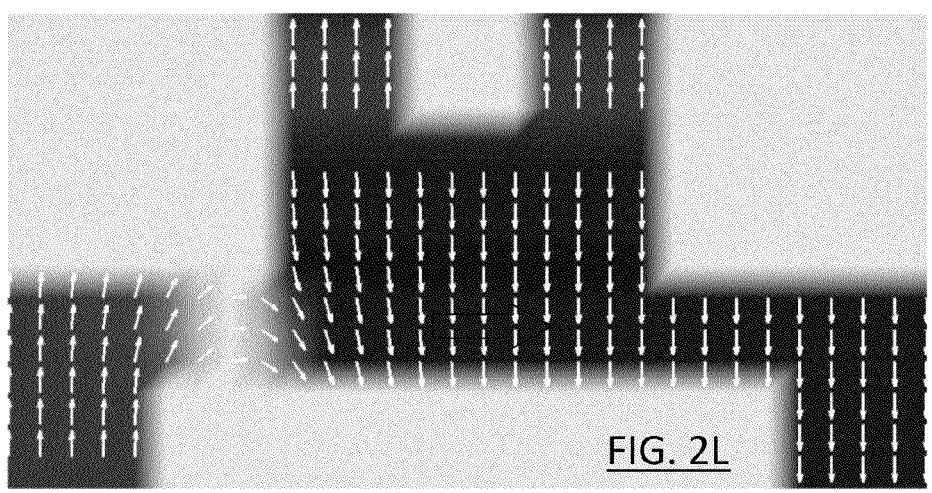

In its lower-resistance state (as depicted in FIG. 1A), the magnetization in the magnetic evaluation layer (5) is substantially aligned with that of the evaluation electrodes (7a-b), which causes the evaluation path to display a lower resistance.

In its higher-resistance state (as depicted in FIG. 1b), the magnetization in the magnetic evaluation layer (5) is substantially perpendicular to that of the evaluation electrodes (7a-b), which causes the evaluation path to display a higher resistance.

Figure 3:
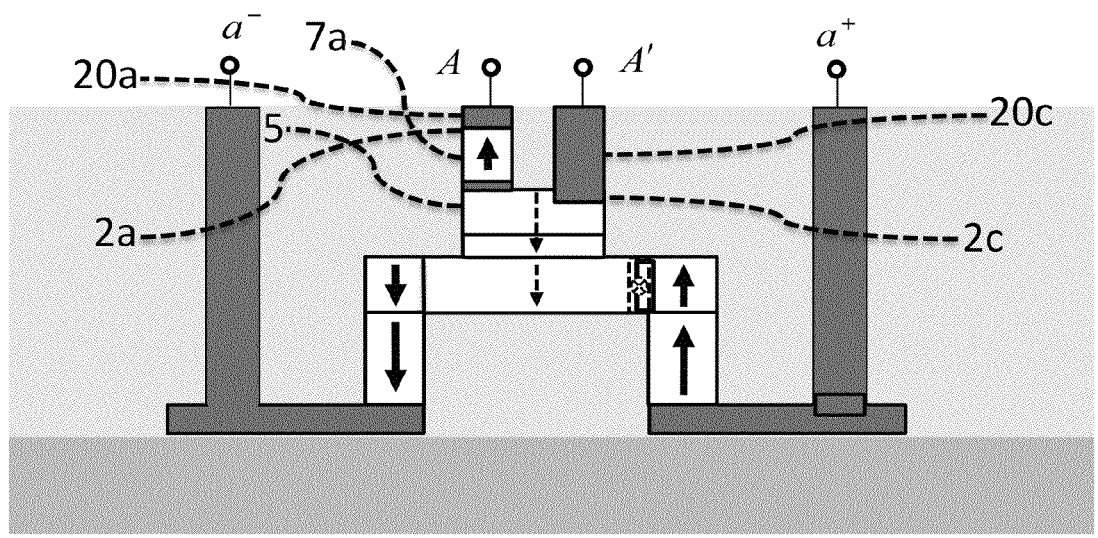
FIG. 3 depicts an illustrative alternative mCell that contains only one tunnel (or other) junction in its evaluation path.

FIG. 3 depicts an alternative mCell in which the evaluation path includes only one tunnel (or other) barrier. In this embodiment, a first contact (20a) provides the first evaluation terminal (2a), and a second, enlarged contact (20c) provides the second evaluation terminal (2c). Consequently, the path between evaluation terminals (2a and 2c) crosses only one tunnel junction between the first evaluation electrode (7a) and the magnetic evaluation layer (5).

Figure 4A:
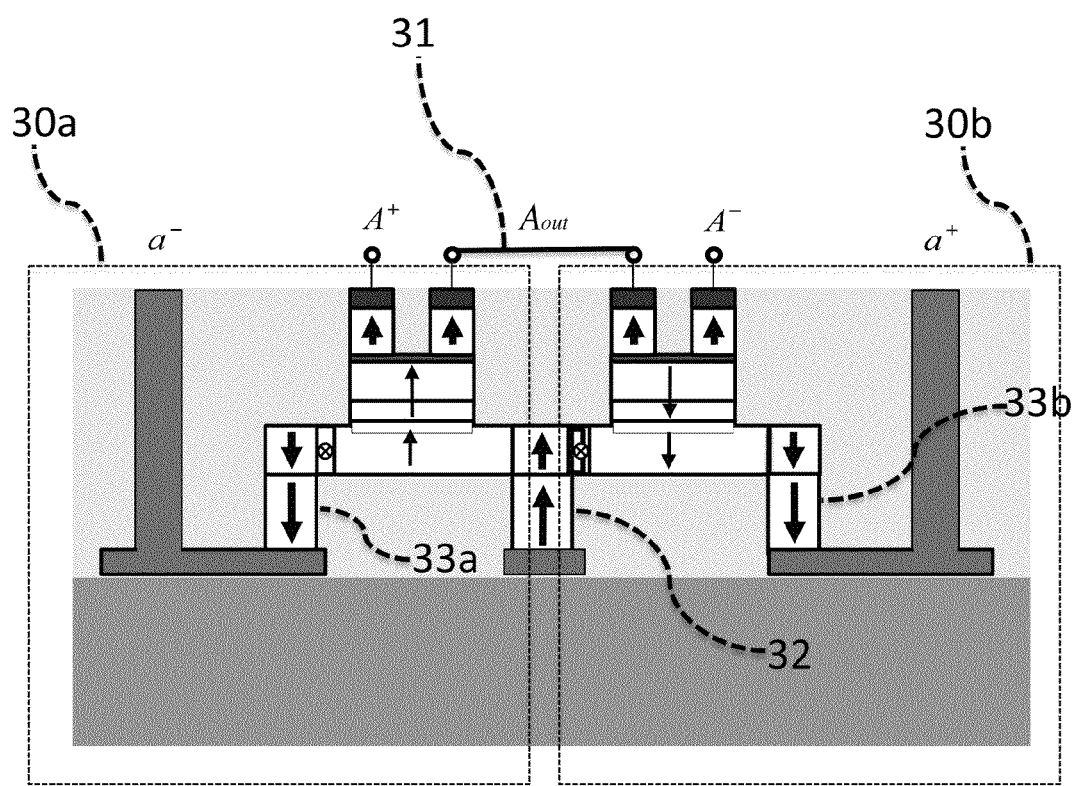
FIGS. 4A-B depict an illustrative complimentary magnetic switching cell inverter (c-mCell-inv) in its high and low output states, respectively.

FIG. 4A depicts an illustrative complimentary mCell inverter (c-mCell-inv) in its high output state. This c-mCell-inv comprises first (30a) and second (30b) mCells that are configured to share a common evaluation terminal (31) [or, alternatively, a common evaluation contact (not illustrated)] and a common programming electrode (32). To create the high output state depicted in FIG. 4A, a current flows from the negative input terminal (a⁻) to the positive input terminal (a⁺), which causes the domain wall in the first mCell (30a) to position itself proximate to the first programming electrode (33a) and causes the domain wall in the second mCell (30b) to position itself proximate to the common programming electrode (32). With the domain walls so-positioned, the first mCell's (30a's) evaluation path assumes its lower-resistance state, and the second mCell's (30b's) evaluation path assumes its higher-resistance state. This produces a voltage division that results in the output terminal ($A_{out}$) assuming a value closer to the positive supply (A⁺) than to the negative supply (A⁻). [Those skilled in the art will understand that the terms "positive supply" and "negative supply" are used in their relative, rather than absolute, sense. Neither term requires a voltage that is positive or negative relative to an absolute reference (or ground) voltage; rather, they merely require that the "positive supply" provide a higher voltage (e.g., 2V) than the "negative supply" (e.g., 1V), thereby making them positive and negative with respect to an arbitrary intermediate reference point (e.g. 1.5V).]

Figure 4B:
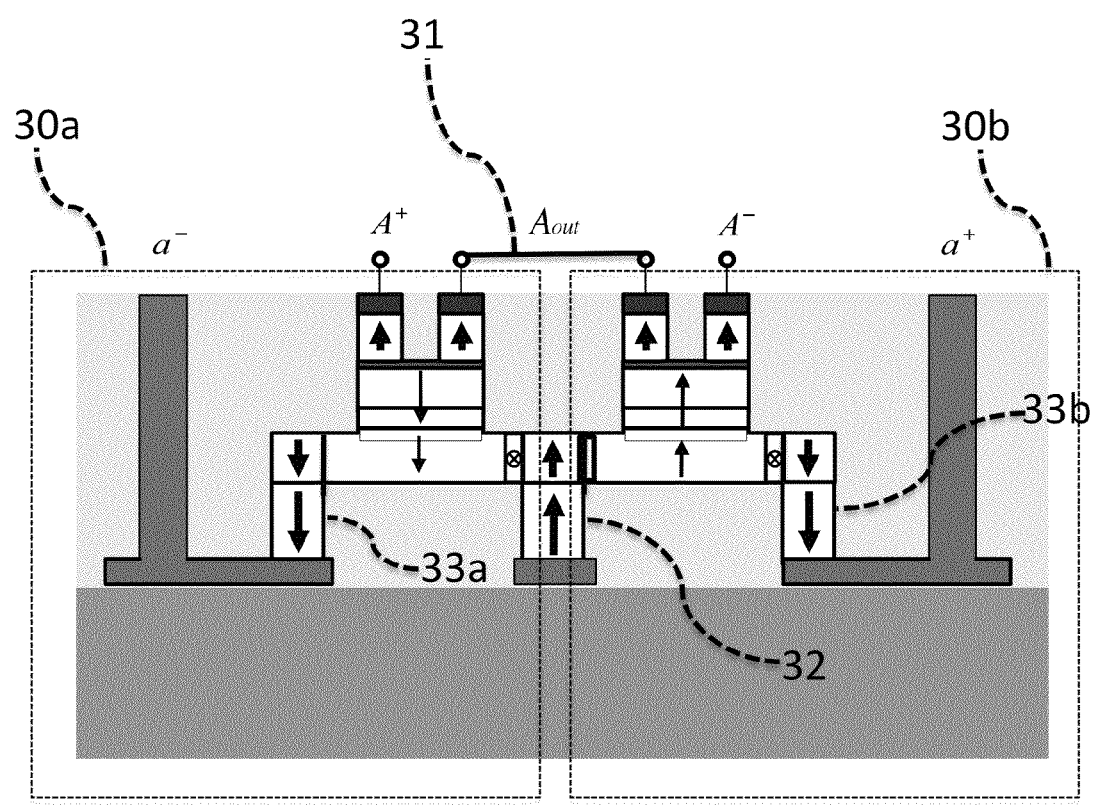
Figure 5A:
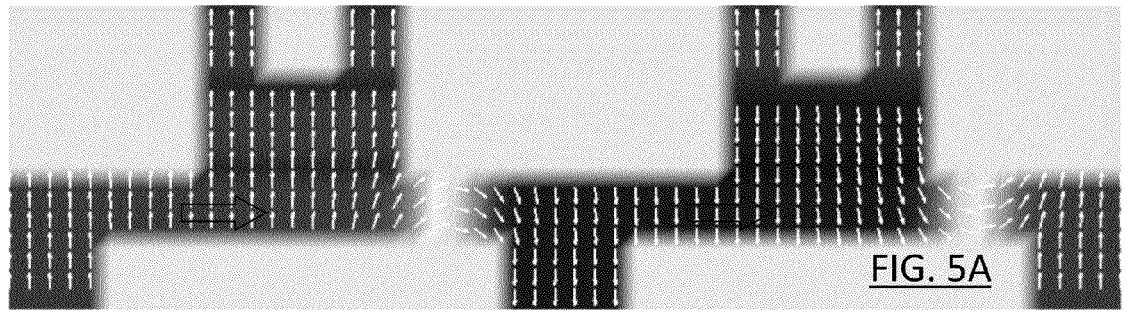
FIGS. 5A-D depict a micro-magnetic simulation of a c-mCell inverter (or buffer) in which a 1 ns (left-to-right) current pulse causes domain walls in the respective left and right mCells to relocate to the left side of their respective cells, thus causing the left mCell to assume its higher-resistance state and the right mCell to assume its lower-resistance state.
Figure 5B:
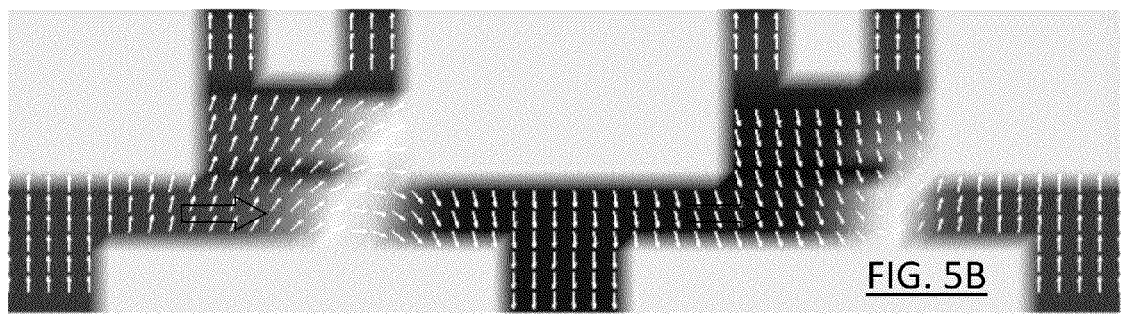
Figure 5C:
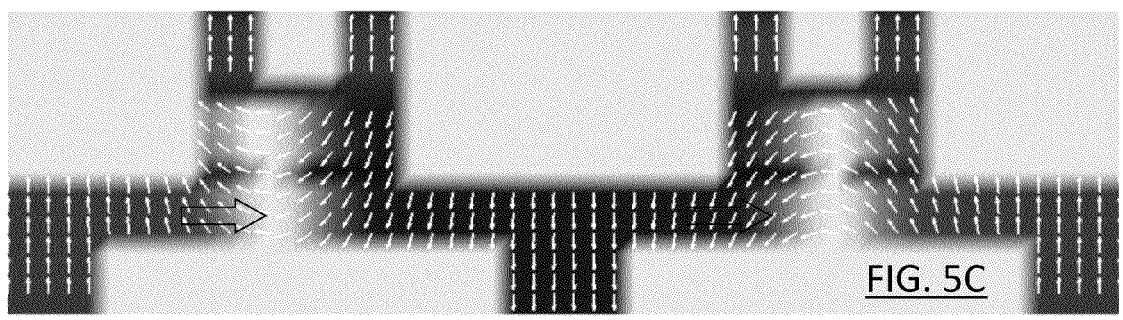
Figure 5D:
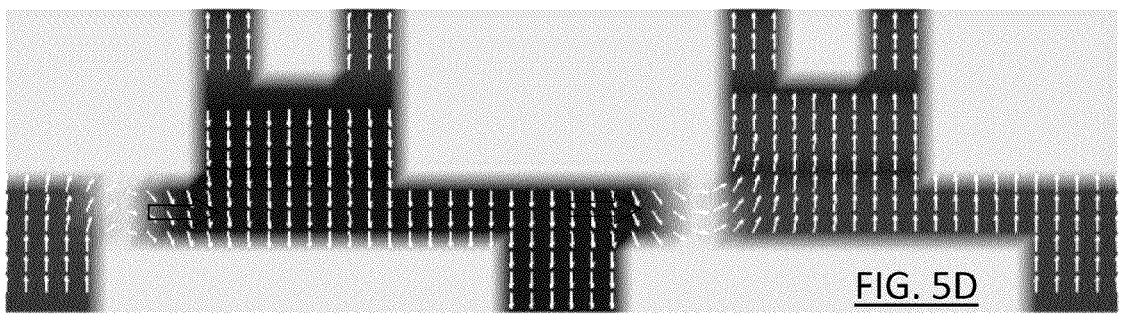
Figure 5E:
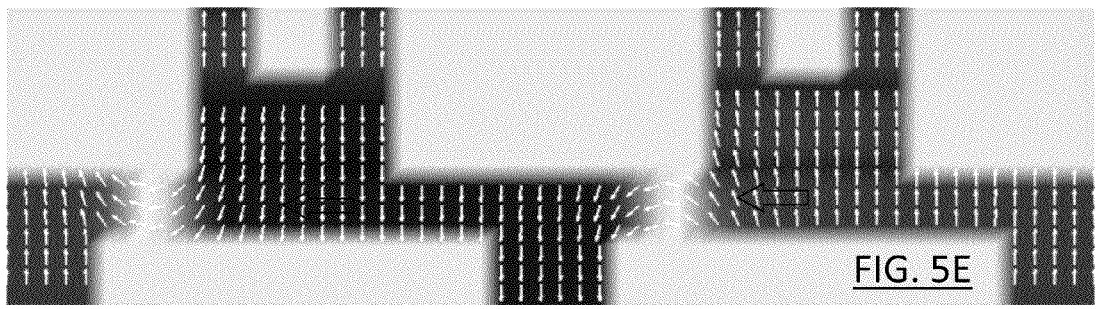
FIGS. 5E-H depict a further micro-magnetic simulation of the c-mCell inverter (or buffer) in which a 1 ns (right-to-left) current pulse causes domain walls in the respective left and right mCells to relocate to the right side of their respective cells, thus causing the left mCell to assume its lower-resistance state and the right mCell to assume its higher-resistance state.
Figure 5F:
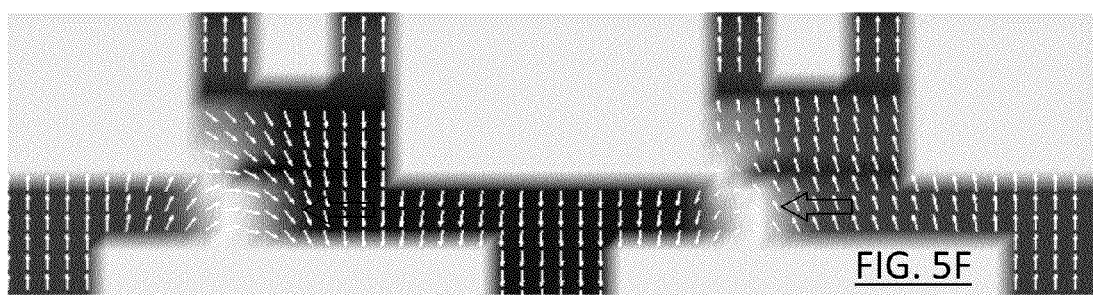
Figure 5G:
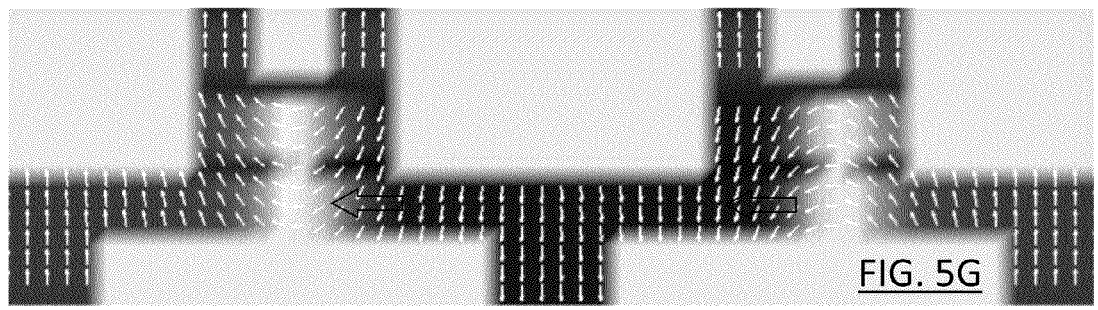
Figure 5H:
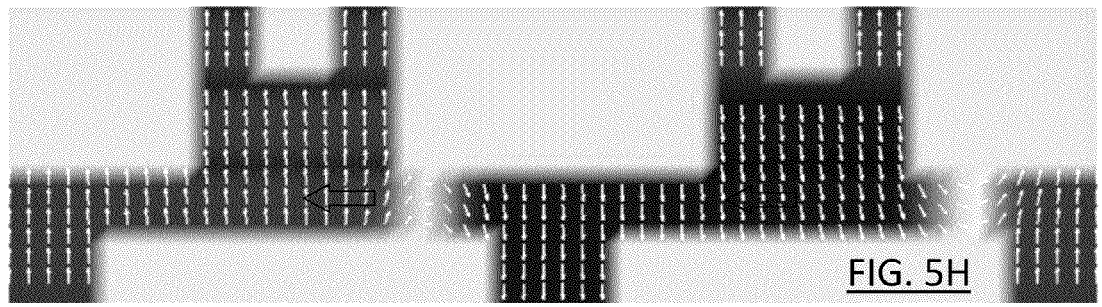
Figure 6:
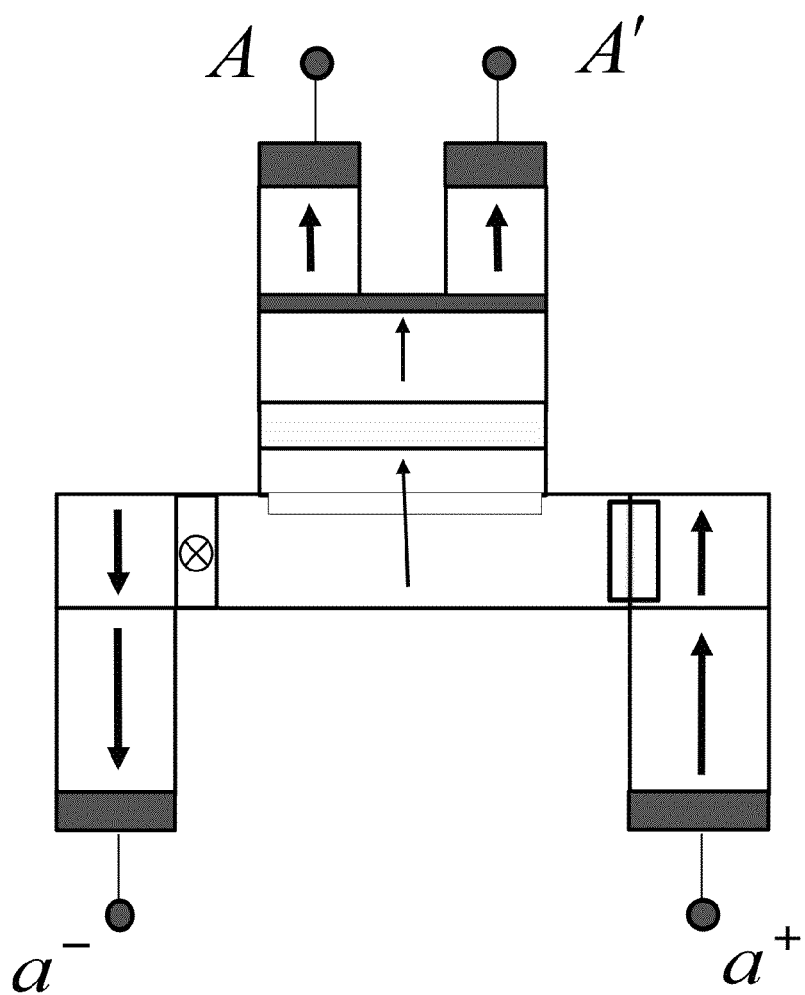
FIG. 6 depicts illustratively depicts an alternative embodiment of an mCell, in which the magnetic coupling between the domain switching region and evaluation region operates via magnet field switching through an intervening non-magnetic layer.
Figure 7A:
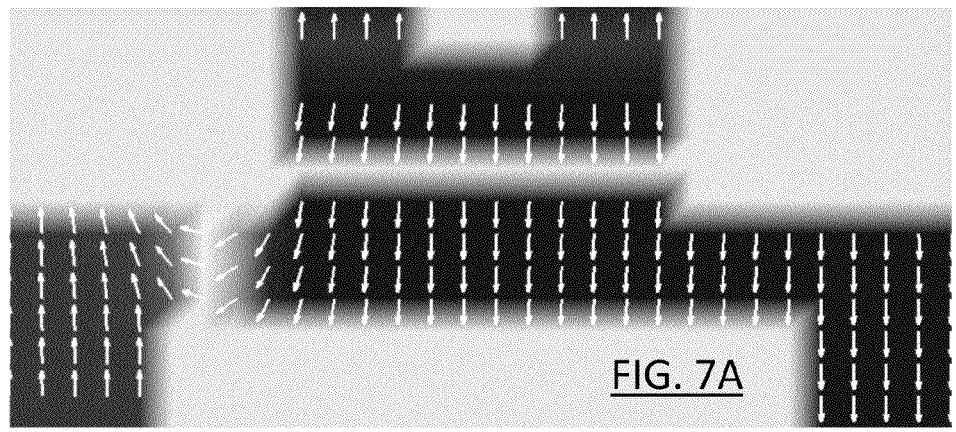
FIGS. 7A-F depict a micro-magnetic simulation of a state change for the FIG. 6 device.
Figure 7B:
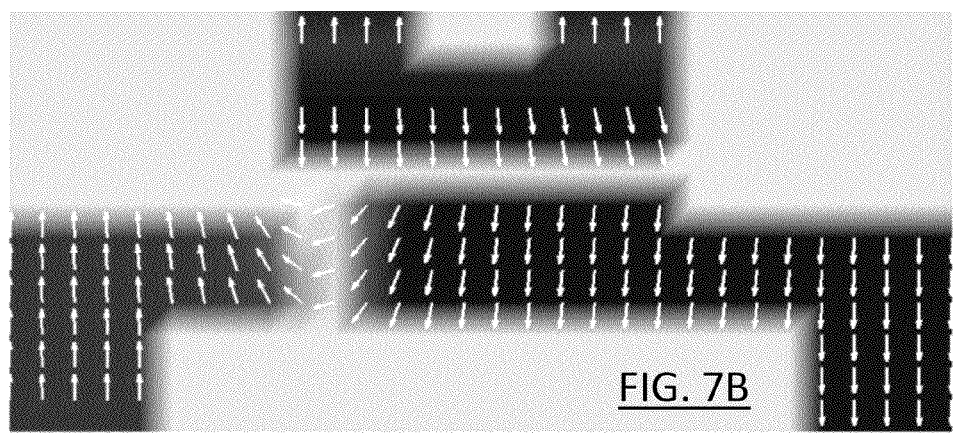
Figure 7C:
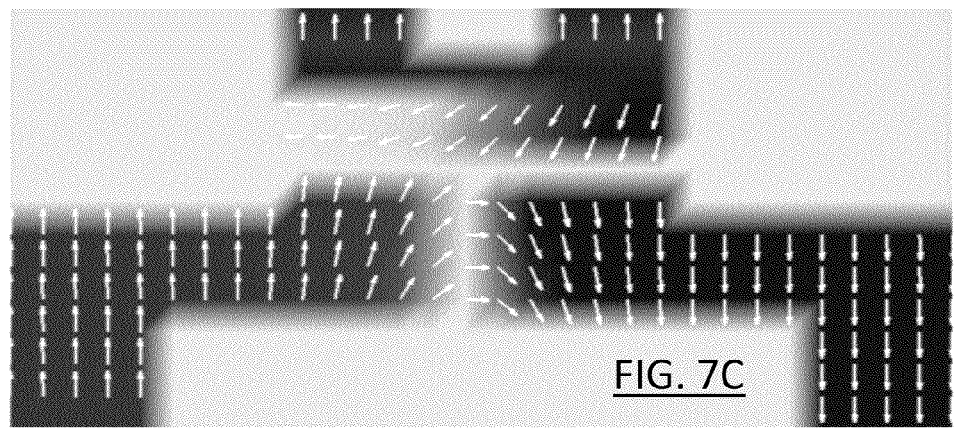
Figure 7D:
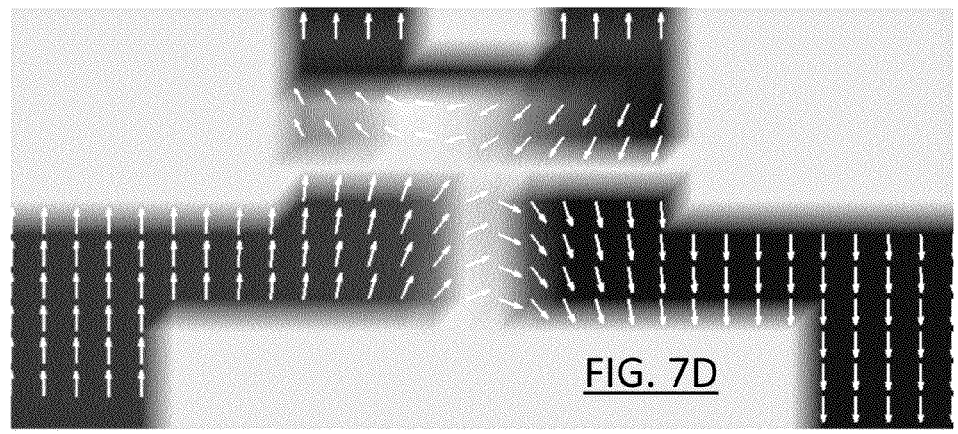
Figure 7E:
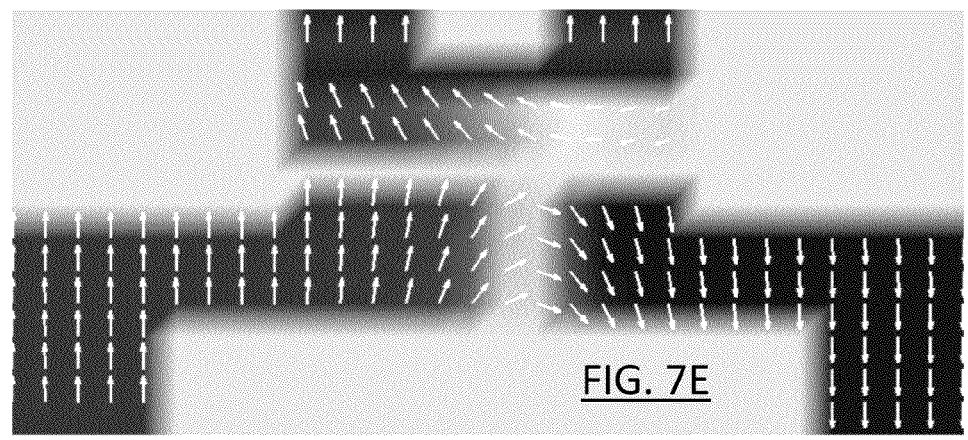
Figure 7F:
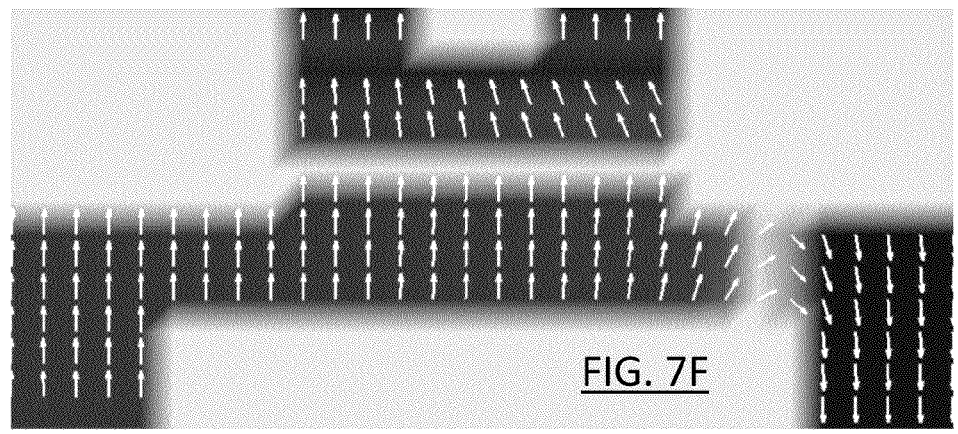

The low output state of the c-mCell-inv is depicted in FIG. 4B. To produce this state, a current flows from the positive input terminal (a⁺) to the negative input terminal (a⁻), which causes the domain wall in the first mCell (30a) to position itself proximate to the common programming electrode (32) and causes the domain wall in the second mCell (30b) to position itself proximate to the second programming electrode (33a). With the domain walls so-positioned, the first mCell's (30a's) evaluation path assumes its higher-resistance state, and the second mCell's (30b's) evaluation path assumes its lower-resistance state. This produces a voltage division that results in the output terminal ($A_{out}$) assuming a value closer to the negative supply (A⁻) than to the positive supply (A⁺).

The same structure depicted in FIGS. 4A-B can be configured as a complimentary mCell buffer (c-mCell-buf) by reversing the polarity of the positive ($a^+$) and negative ($a^-$) input terminals, or by reversing the polarity of positive ($A^+$) and negative ($A^-$) supply terminals.

FIGS. 5A-D contain snapshots from a micro-magnetic simulation of a c-mCell inverter/buffer in which a 1 ns (left-to-right, as depicted by the block arrows) current pulse causes domain walls (the light regions with substantially horizontal field lines) in the respective left and right mCells to relocate to the left side of their respective cells, thus causing the left mCell to assume its higher-resistance state and the right mCell to assume its lower-resistance state. FIGS. 5A, 5B, 5C and 5D represent the state of the c-mCell at t=0 ns, t=0.55 ns, t=0.67 ns and t=0.82 ns, respectively.

FIGS. 5E-H contain snapshots from a further micro-magnetic simulation of the c-mCell inverter/buffer in which a ins (right-to-left) current pulse causes domain walls in the respective left and right mCells to relocate to the right side of their respective cells, thus causing the left mCell to assume its lower-resistance state and the right mCell to assume its higher-resistance state. FIGS. 5E, 5F, 5G and 5H represent the state of the c-mCell at t=0 ns, t=0.52 ns, t=0.70 ns and t=0.90 ns, respectively.

In accordance with certain aspects/embodiments of the invention, logic gates, circuits and systems can be constructed using a perpendicular MRAM device. These embodiments are discussed at Appendix A (pages 2-9) of the incorporated '743 application.

The preferred embodiments of the invention utilize mCell devices with isolation between the programming and evaluation paths, as described in exemplary detail below.

Figure 8:
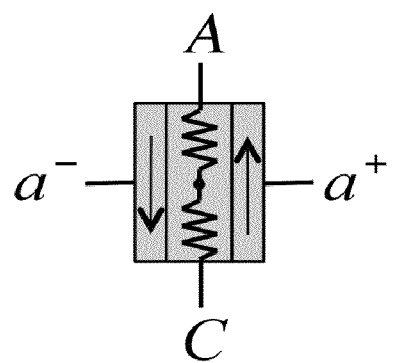
FIG. 8 depicts a new schematic symbol used to represent the mCells of the type illustrated in FIGS. 1, 3, and/or 6.

FIG. 8 shows a new schematic symbol for the inventive mCells. As depicted, it is a four-terminal device. The programming path extends between the first ($a^-$) and second ($a^+$) programming terminals, and the evaluation path extends between the first (A) and second (C) evaluation terminals. As previously described, a current pulse that flows from the first ($a^-$) to the second ($a^+$) programming terminal will cause a domain wall repositioning that produces the lower-resistance state, as measured between evaluation terminals (A-C). Conceptually, this is illustrated by the down-arrow in the schematic symbol—i.e., currents flowing "into" the down-arrow ($a^-$) terminal cause the evaluation path (A-C) resistance to go "down," following the electron flow and fixed magnetic material polarity convention established in FIG. 1. Similarly, currents flowing into the up-arrow ($a^+$) terminal cause the evaluation path (A-C) resistance to go "up."

A point worth noting, here, is that mCells are fundamentally current-responsive devices with memory. So, while the output state (e.g., the A-C resistance) is "responsive" to logic signals (e.g., currents) that flow between the programming terminals, the response is both immediate (e.g., the domain wall switches in about a 1 ns) and long-term. However, depending upon the circuit configuration, the resulting resistance change might not have any effect until some clock, switch or other device enables current flow through the device's evaluation path. In the preferred embodiments that use two-phase clocking in which mCells program on one phase and evaluate on another, the "response" of a particular mCell to an input signal will not be "seen" by the rest of the circuit until the next clock phase—by which point the input signal is no longer being applied. Accordingly, the terms "in response," "responsive" and the like should be read to cover immediate response, delayed (e.g., next clock phase) response or both, depending upon the context.

Figure 9A:
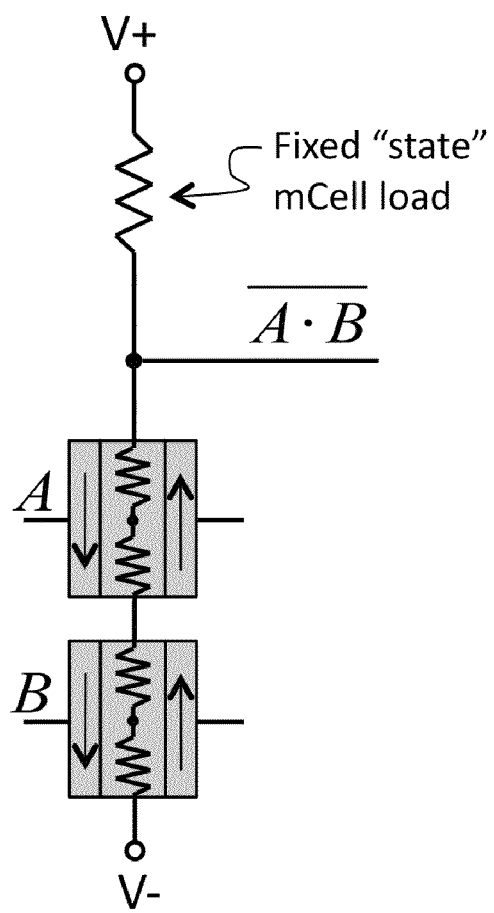
FIG. 9A depicts an illustrative mCell-based NAND2 gate in a single-ended, passive-load implementation.

FIG. 9A shows an exemplary magnetic logic circuit (a NAND2 gate) in a single-ended (non-differential), passive-load (non-complimentary) configuration. The depicted inverter contains plural mCells. The upper mCell (that receiving the A input) is configured as a logic-driving cell with one of its evaluation terminals coupled indirectly to the negative supply terminal (V−) and the other of its evaluation terminals connected to the gate's output node (the NOT(A AND B) output), which can be connected to drive the programming terminals of multiple fanout-receiving mCells (not depicted). When the logic-driving cell is in its lower-resistance state, current(s) coupled from the supply terminal through the evaluation path of the logic-driving cell and through the programming paths of the fanout-receiving cells set the resistance states of the fanout-receiving cells. Because the mCells have very low resistance through their programming paths and because the programming operation is inherently current-based, the preferred fanout scheme is to serially connect one fanout cell to the next, such that driving currents pass sequentially through each fanout cell; however, although not preferred, the invention can also accommodate parallel fanout connections, similar to those used with traditional logic families. [Additional examples of magnetic logic circuits in the single-ended, non-complimentary form are show in Appendix A, FIG. 7 of the '743 application.]

In order to fully appreciate the content of FIG. 9A (and the other circuit drawings), one should understand certain drawing conventions. First, the positive and negative supplies (shown as V+ and V−) need not be any particular voltage. Moreover, these supplies need not be continuous. Indeed, at least one (and preferably both) are pulsed, and the system as a whole is operated on a two-phase clocking scheme, as is elsewhere discussed.

Second, the programming inputs of the mCells that are depicted as "unconnected" are not, in fact, left floating, but rather connected to some reference point. The reference point could be an intermediate voltage somewhere between the positive and negative supplies, or it could be one of the supplies, and the reference point need not be continuous—as its value only matters when the mCells are sourcing or sinking a current. [In the case of differential design, a gate might be depicted as receiving a single logic input, but it would be naturally understood by those skilled in the art that such a gate would receive the other end of the differential signal on its "unconnected" input.]

Third, what is shown as a "passive" load resistor could be—and preferably is, for matching purposes—a fixed-state mCell.

Figure 9B:
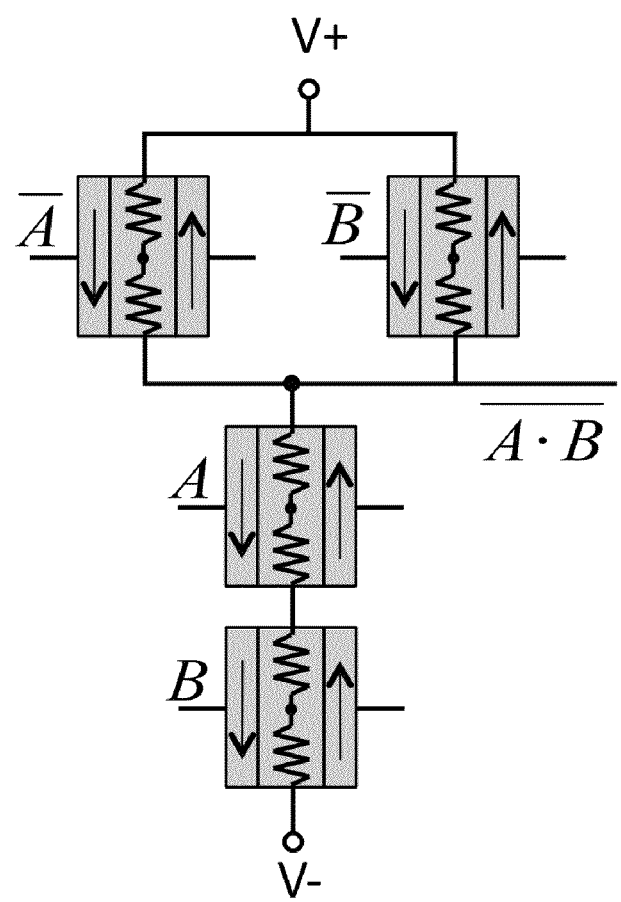
FIG. 9B depicts an illustrative mCell-based NAND2 gate in an alternative, single-ended, complementary implementation.

FIG. 9B shows the same logic function as FIG. 9A (a NAND2 gate), but this time implemented in a single-ended (non-differential), active-load (complimentary) mCell configuration. FIG. 9B is essentially self-explanatory. However, one drawing convention is worth noting.

In FIG. 9B, the upper-stack mCells are shown as receiving the logically inverted inputs (not-A and not-B, respectively), which persons skilled in the art would immediately recognize as potentially complicating—because such inverted literals are not always available. The invention, however, provides this for free, because rather than connecting the not-A/not-B literals to the respective first programming terminals of the upper-stack mCells (as FIG. 9B literally shows), the non-inverted A/B literals can be instead connected to the respective second programming terminals of the upper-stack mCells to achieve the identical logical result. While FIG. 9B is intended to covey both possible implementations, it will be understood that the second implementation (using the non-inverted literals) would typically be preferred, except for example in a case where the inverted literal was already available in the immediate proximity of the relevant input terminal.

Figure 10:
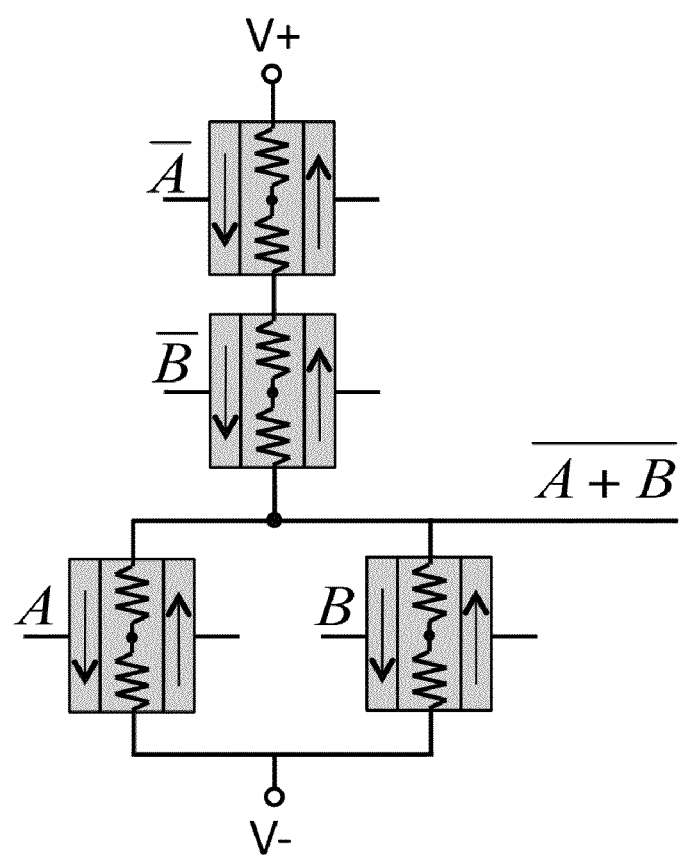
FIG. 10 depicts an illustrative mCell-based NOR2 gate in a single-ended, complementary implementation.

FIG. 10 shows an exemplary mCell implementation of a NOR2 logic gate in the single-ended, complimentary style. Here, too, while the upper-stack mCells of this NOR2 gate are literally depicted as receiving the inverted literals at their respective first programming terminals, the drawing is intended to also convey a preferred implementation in which the upper-stack mCells receive the non-inverted literals at their respective second programming terminals.

Figure 11:
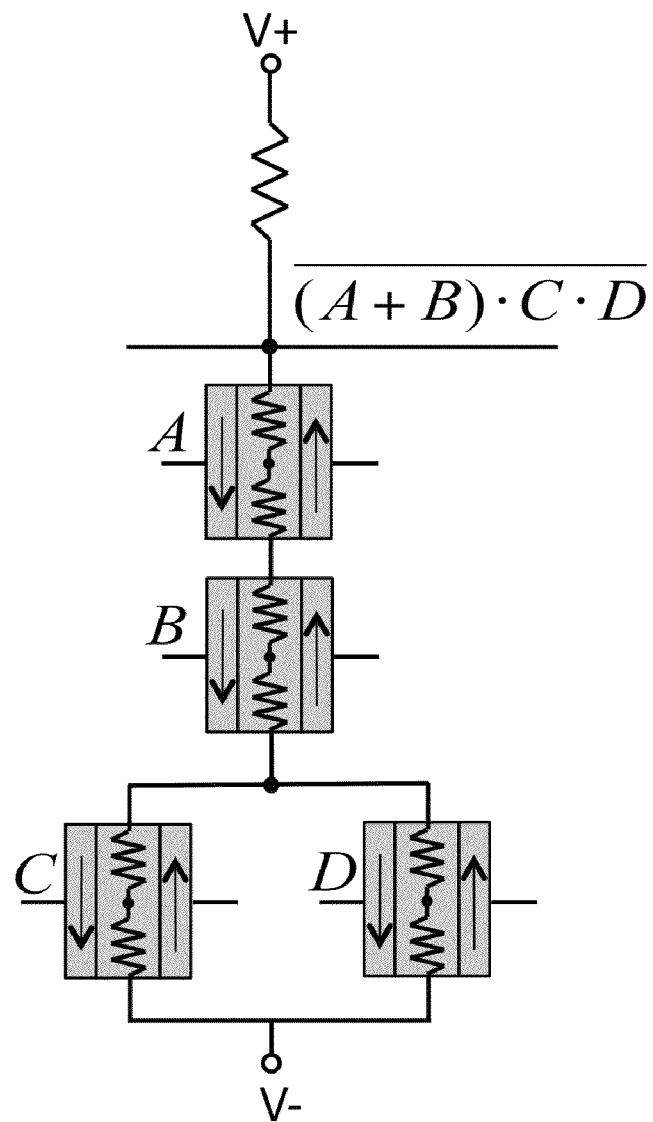
FIG. 11 depicts an illustrative mCell-based implementation of a complex (OAI) logic function in a single-ended, passive-load form.

FIG. 11 depicts a single-ended, passive-load mCell implementation of a complex (OR-AND-INVERT) logic function. As with FIG. 9A, even though the load is illustratively depicted as a resistor, FIG. 11 is intended to convey a preferred implementation in which the load element would be realized as a properly ratioed mCell with its inputs fixed.

Figure 12A:
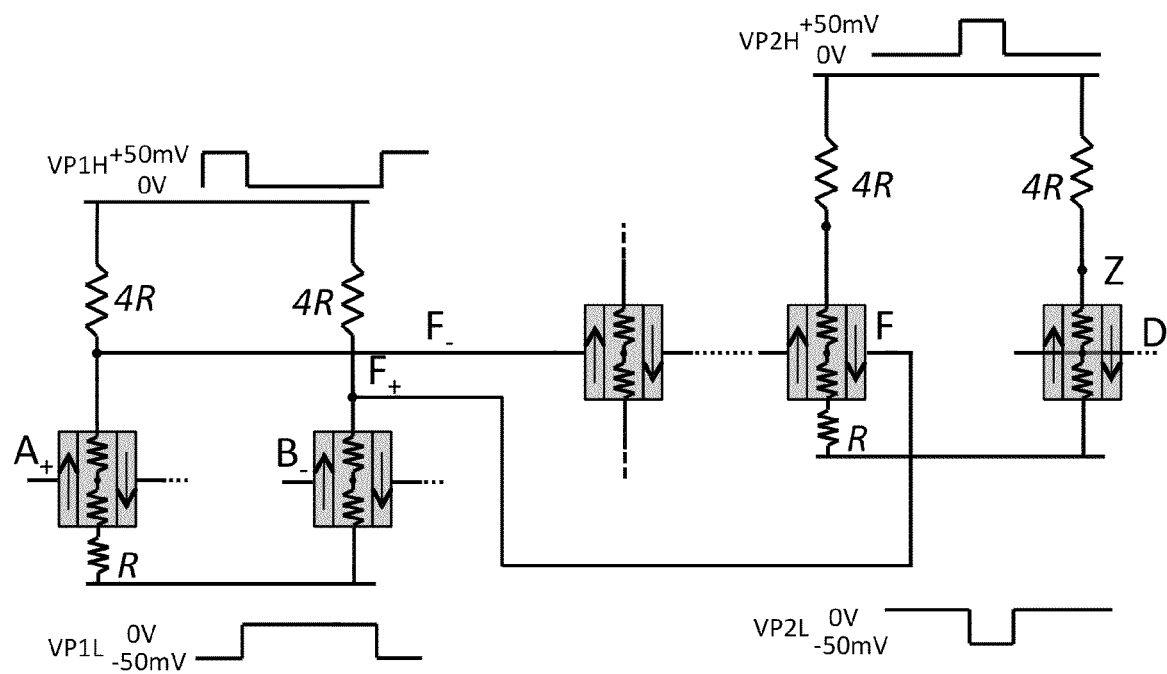
FIG. 12A illustrates a differential, mCell-based, passive-load implementation of the logic circuit (portion) schematically depicted in FIG. 12B.
Figure 12B:
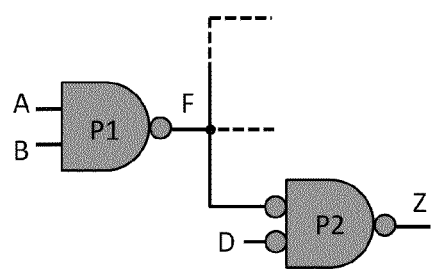
FIG. 12B schematically depicts the logic circuit (portion) illustrated in FIG. 12A.

FIGS. 12A-B illustratively depict the logic fanout for portion of a differential, passive-load mCell implementation. As depicted in FIG. 12A, each gate operates on a different clock phase with its own pulsed positive and negative supplies. This two-phase operation is annotated in the logic diagram of FIG. 12B by the "P1" and "P2" designations, which indicate whether the gate activates its evaluation path on the first or second phase.

Figure 13A:
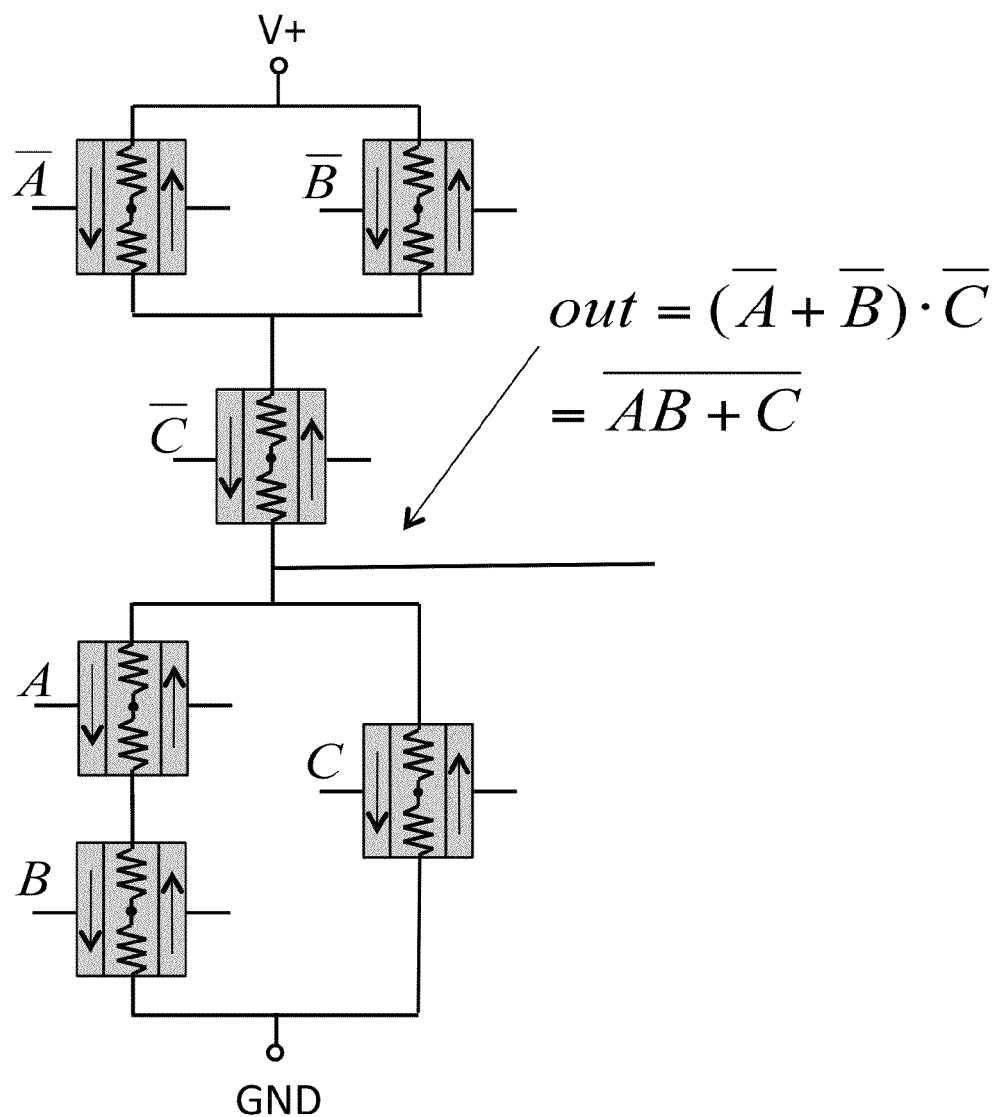
FIG. 13A depicts another illustrative mCell-based implementation of a complex (AOI) logic function in a single-ended, complimentary form.

FIG. 13A depicts another illustrative mCell-based implementation of a complex (AOI) logic function in the single-ended, complimentary form. As with the previous figures, FIG. 13A is intended to convey a preferred implementation in which the upper-stack mCells receive non-inverted literals at their respective second programming inputs.

Figure 13B:
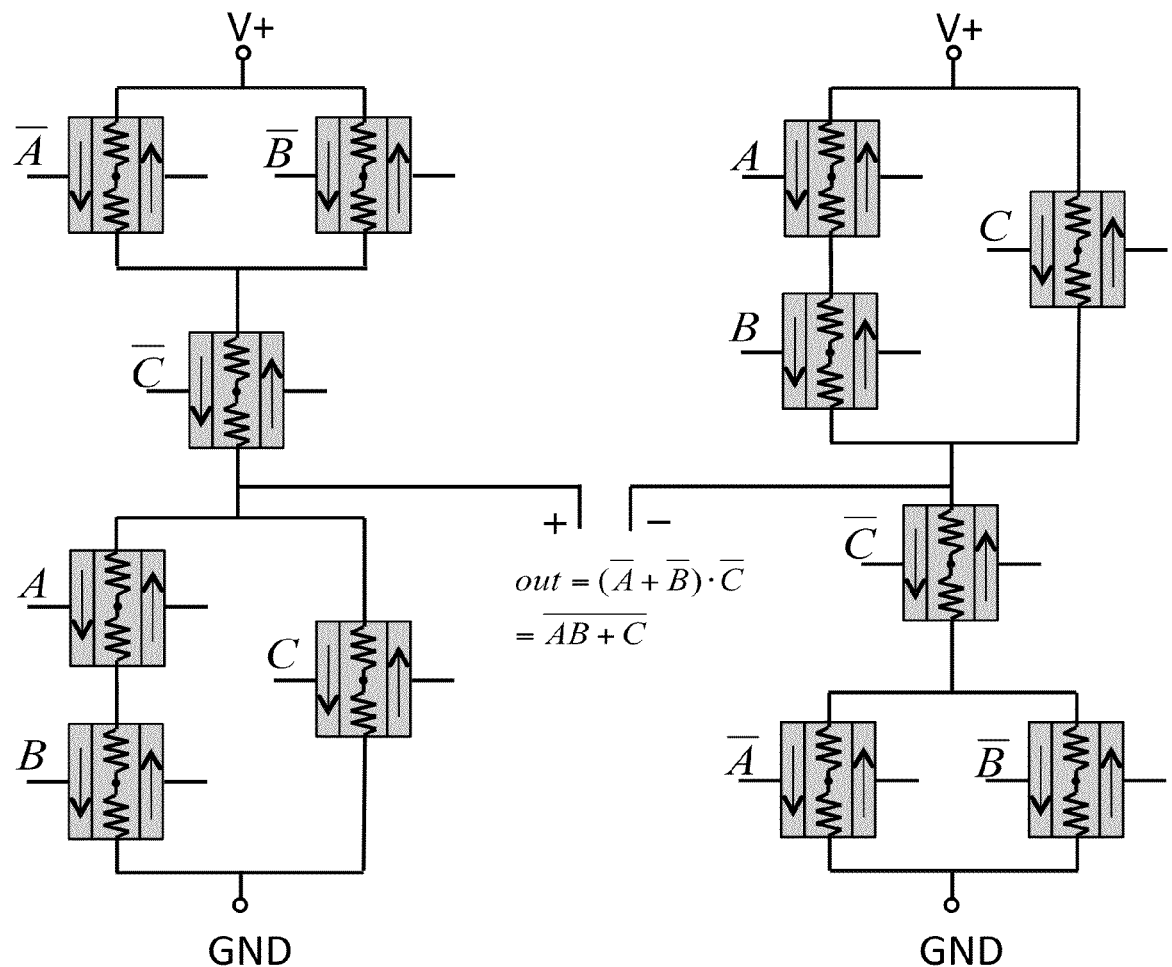
FIG. 13B depicts an alternative mCell-based implementation of the complex logic function of FIG. 13A, using a differential, complimentary form.

FIG. 13B depicts an alternative mCell-based implementation of the AOI function of FIG. 13A, but this time using a differential, complimentary form. In FIG. 13B, as with all the differential designs, each mCell receives dual (differential) inputs. So when the drawing shows a given mCell (those in the upper stack, for example) as receiving an inverted literal, this is intended to convey that the input-to-programming-terminal connections on that mCell are flipped relative to the connections on the mCell that received the non-inverted literal.

Figure 14A:
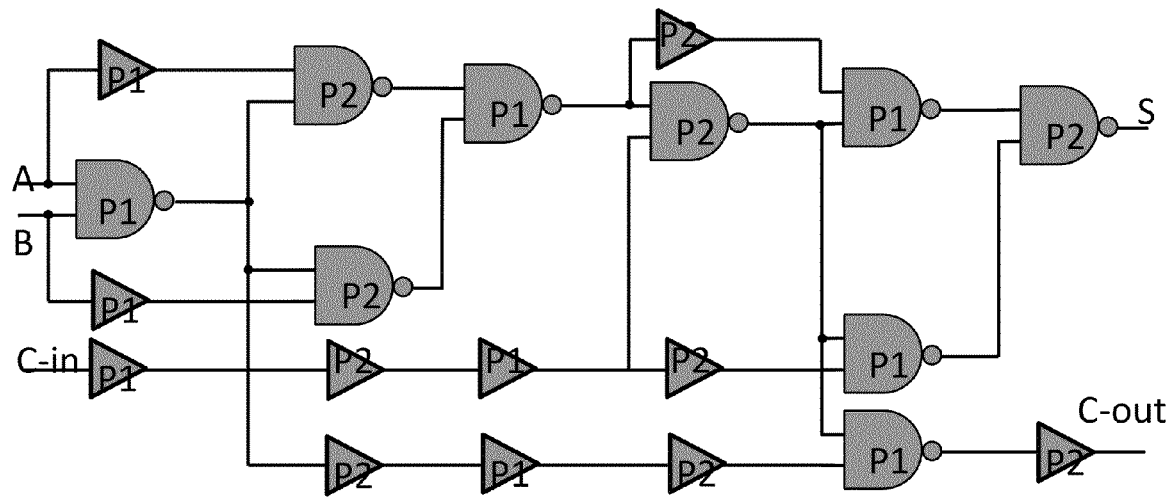
FIG. 14A depicts an illustrative two-phase, mCell-based implementation of a half adder circuit.
Figure 14B:
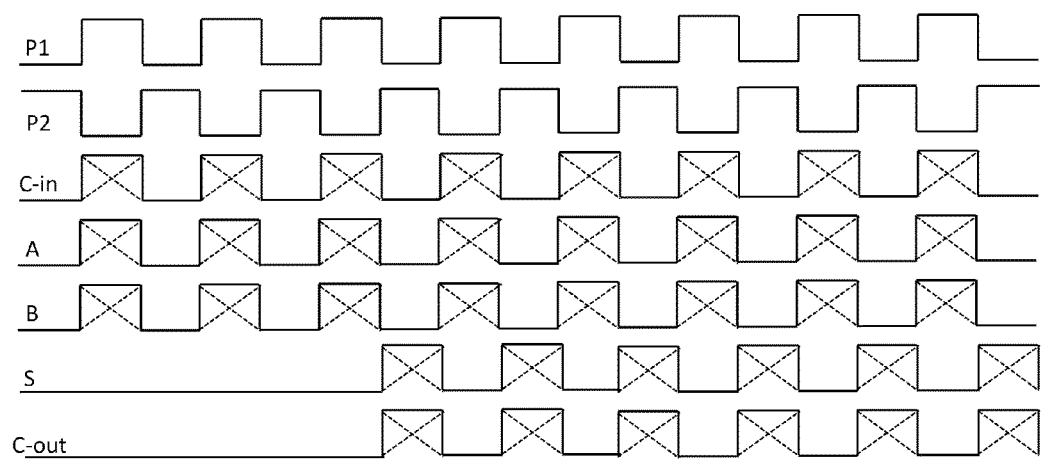
FIG. 14B contains a timing diagram for the half adder circuit of FIG. 14A; and, FIGS. 15A-G various steps in an illustrative monolithic fabrication process for making integrated mCell-based systems.
Figure 15A:
Figure 15B:
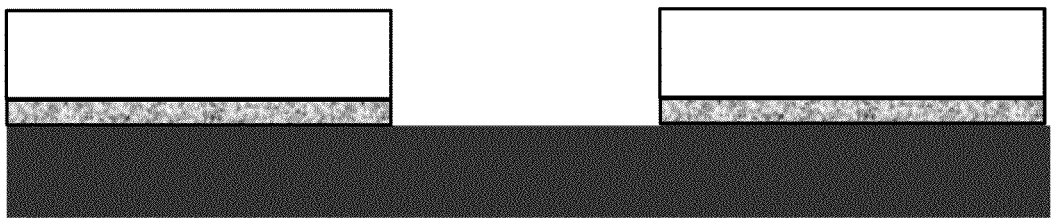
Figure 15C:
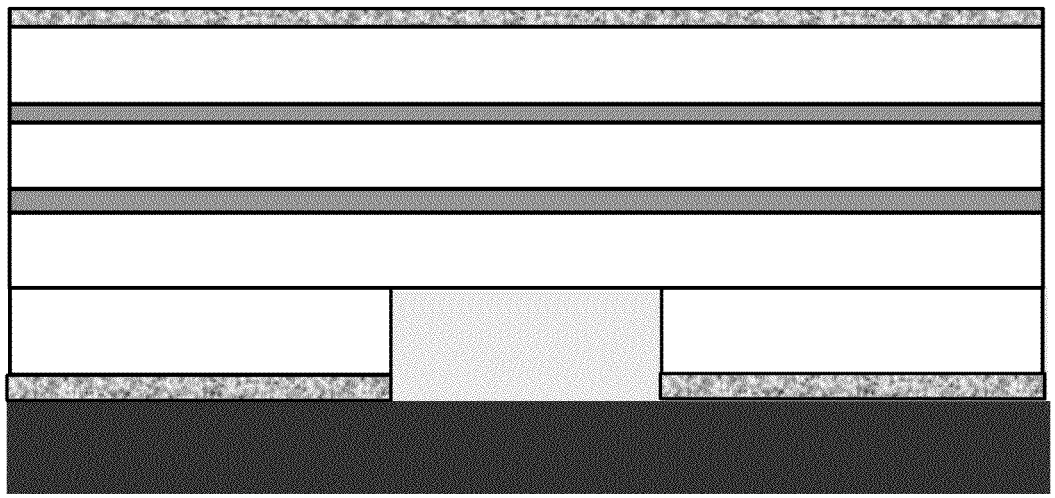
Figure 15D:
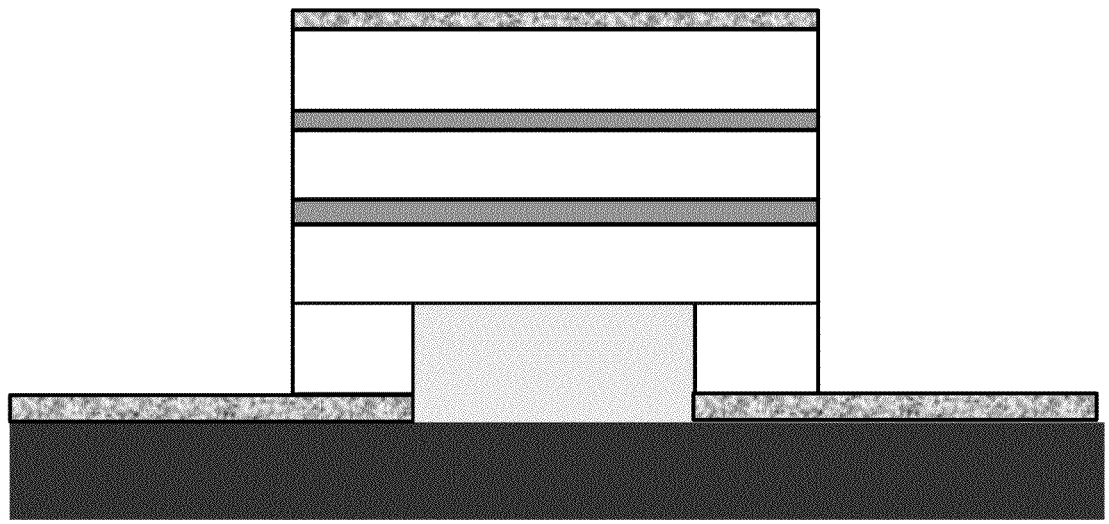
Figure 15E:
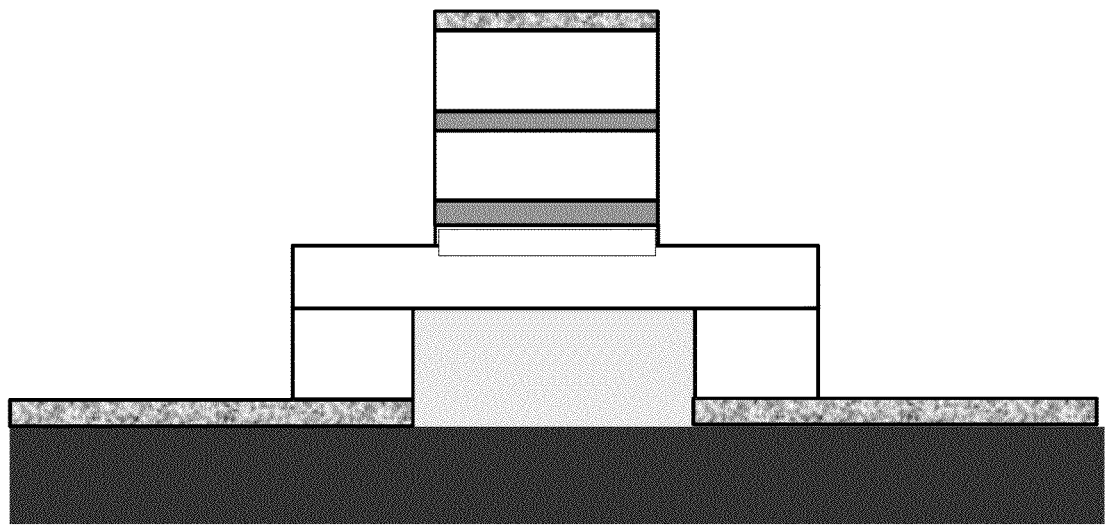
Figure 15F:
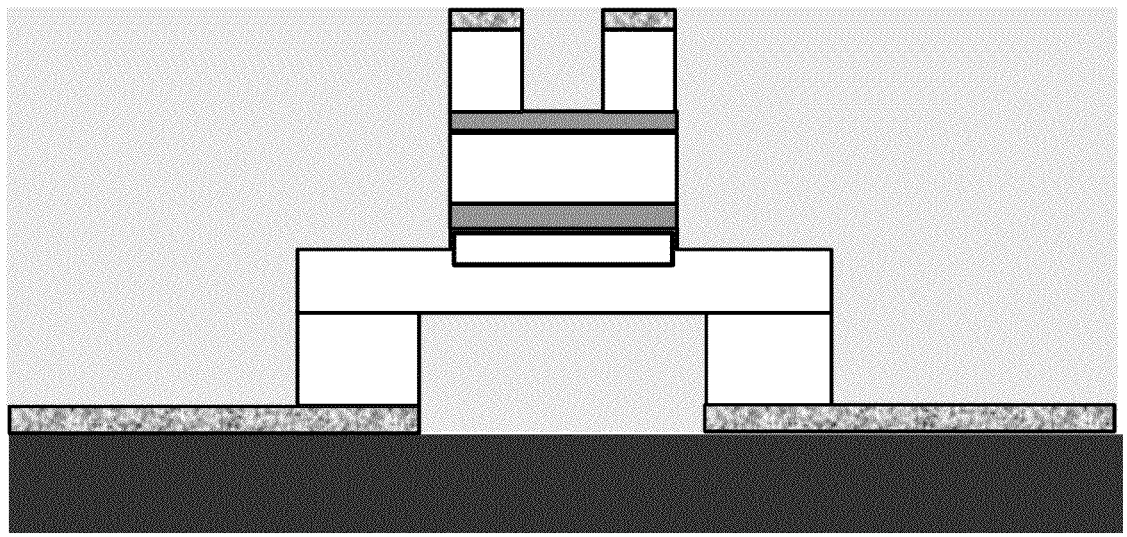
Figure 15G:
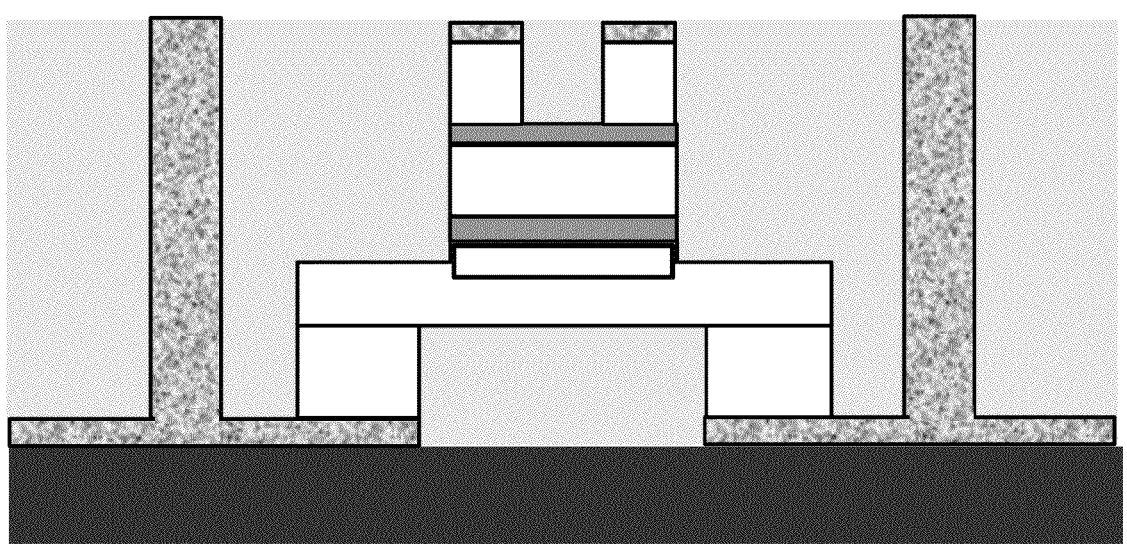

FIG. 14A depicts an illustrative two-phase, mCell-based implementation of a half adder circuit. As with FIG. 12B, the phase designations (P1/P2) in FIG. 14A identify the phase on which each labeled gate activates its evaluation path. FIG. 14B provides a timing diagram for the logic of FIG. 14A. As persons skilled in the art will appreciate, FIG. 14A conveys multiple, alternative implementations in each of the above-enabled forms: (1) single-ended, passive load; (2) single-ended, complimentary; (3) differential, passive load; and (4) differential, complimentary. Additionally, as previously noted, systems such as FIG. 14A can be implemented using a mixture of these and other logic styles at different gates or stages.

While the foregoing discussion and drawings have illustrated several examples of the invention and its application, the potential application of these teachings is very broad and not easily enumerated. Accordingly, this invention shall in no way be limited to or by the specific illustrative embodiments, but rather only by the claims and their equivalents.

What is claimed is:

1. A magnetic logic circuit comprising:
    a plurality of magnetic switching cells (mCells), each mCell comprising:
        first and second programming terminals connected to respective ends of a low-resistance programming path;
        first and second evaluation terminals connected to respective ends of an evaluation path whose resistance can switch between at least a first, lower-resistance state and a second, higher-resistance state in response to signals magnetically coupled from said programming path, said programming and evaluation paths being electrically isolated;
    at least one of said plural mCells configured as a logic-driving cell with one of its evaluation terminals coupled, directly or indirectly, to a supply terminal and the other of its evaluation terminals connected to a programming terminal of at least two respective fanout-receiving mCells, such that when said logic-driving cell is in its lower-resistance state, current(s) coupled from said supply terminal through the evaluation path of said logic-driving cell and through the programming paths of said fanout-receiving cells set the resistance states of said fanout-receiving cells.

2. The magnetic logic circuit of claim 1, wherein said supply terminal is connected to a pulsed supply that provides an alternating sequence of ON and OFF supply states.

3. The magnetic logic circuit of claim 2, wherein the resistance states of said fanout-receiving cells can only change when the pulsed supply is in its ON supply state.

4. The magnetic logic circuit of claim 3, wherein an evaluation terminal of each of the fanout-receiving mCells is connected, directly or indirectly, to a second supply terminal, wherein said second supply terminal is connected to a second pulsed supply that provides an alternating sequence of ON and OFF supply states, and wherein the ON supply states of the first and second supplies do not overlap, thereby providing two-phase clocking between the logic-driving mCell(s) and the fanout-receiving mCells.

5. The magnetic logic circuit of claim 1, wherein at least one of the logic-driving mCells forms a part of a logic gate with a stack depth of at least four, such that the coupling of said logic-driving mCell's evaluation terminal to the supply terminal traverses the evaluation paths of at least three other mCells in the same stack.

6. The magnetic logic circuit of claim 1, wherein at least one of the logic-driving mCells forms a part of a logic gate with a stack depth of at least five, such that the coupling of said logic-driving mCell's evaluation terminal to the supply terminal traverses the evaluation paths of at least four other mCells in the same stack.

7. The magnetic logic circuit of claim 1, wherein at least one of the logic-driving mCells forms a part of a logic gate with a stack depth of at least six, such that the coupling of said logic-driving mCell's evaluation terminal to the supply terminal traverses the evaluation paths of at least five other mCells in the same stack.

8. A complimentary, multi-input magnetic logic circuit comprising:
    at least first, second, and third logic input terminals, each configured to receive a respective logical input signal;
    a logic output terminal that delivers a logical output signal in response to said logical input signals;
    a plurality of magnetic switching cells (mCells), each mCell comprising:
        first and second programming terminals connected to respective ends of a low-resistance programming path; and
        first and second evaluation terminals connected to respective ends of an evaluation path whose resistance can switch between at least a first, lower-resistance state and a second, higher-resistance state in response to signals magnetically coupled from said programming path;

a negative supply terminal;

a positive supply terminal;

half of said plural mCells configured as at least three lower-stack mCells, where each lower-stack mCell has one of its programming terminals connected to receive one of said logical input signals from one of said logic input terminals, and where each lower-stack mCell has one of its evaluation terminals coupled, either directly or via the evaluation path(s) of other(s) of said lower-stack mCells, to said negative supply terminal and the other of its evaluation terminals coupled, either directly or via the evaluation path(s) of other(s) of said lower-stack mCells, to said logic output terminal, said lower-stack mCells connected such that (i) logical input signals selected from a first set of logic values enable low-resistance path(s) between said negative supply terminal and said logic output terminal using one or more of the evaluation path(s) of said lower-stack mCells and (ii) logical input signals not contained in said first set of logic values disable said low-resistance path(s) between said negative supply terminal and said logic output terminal; and, the other half of said plural mCells configured as at least three upper-stack mCells, where each upper-stack mCell has one of its programming terminals connected to receive one of said logical input signals from one of said logic input terminals, and where each upper-stack mCell has one of its evaluation terminals coupled, either directly or via the evaluation path(s) of other(s) of said upper-stack mCells, to said positive supply terminal and the other of its evaluation terminals coupled, either directly or via the evaluation path(s) of other(s) of said upper-stack mCells, to said logic output terminal, said upper-stack mCells connected such that (i) logical input signals not contained within said first set of logic values enable low-resistance path(s) between said positive supply terminal and said logic output terminal using one or more of the evaluation path(s) of said upper-stack mCells and (ii) logical input signals selected from said first set of logic values disable said low-resistance path(s) between said positive supply terminal and said logic output terminal.

9. The complimentary magnetic logic circuit of claim 8, further comprising a first pulsed supply, connected to said positive supply terminal, said first pulsed supply operating according to an alternating sequence of ON and OFF supply states and supplying a higher voltage during its ON state than during its OFF state.

10. The complimentary magnetic logic circuit of claim 8, further comprising a second pulsed supply, connected to said negative supply terminal, said second pulsed supply operating according to an alternating sequence of ON and OFF supply states and supplying a lower voltage during its ON state than during its OFF state.

11. The complimentary magnetic logic circuit of claim 8, further comprising first and second pulsed supplies, respectively connected to said positive and negative supply terminals, said first and second pulsed supplies operating according to an alternating sequence of ON and OFF supply states, whereby during the ON states, said first supply supplies a higher voltage and the second supply supplies a lower voltage, than during the OFF states.

12. The complimentary magnetic logic circuit of claim 11, wherein the resistance states of the mCells switch only during the ON states of the first and second supplies.

13. The complimentary magnetic logic circuit of claim 11, wherein the circuit implements one of the following logic functions:
- and-or-invert (AOI);
- or-and-invert (OAI);
- multiplex (MUX);
- and-or (AO);
- or-and (OA);
- exclusive or (XOR); or,
- not exclusive or (XNOR).

14. The complimentary magnetic logic circuit of claim 8, wherein for each mCell among the lower-stack mCells that receives a logical input signal at its first programming terminal, there exists a corresponding complimentary mCell among the upper-stack mCells that receives the same logical input signal at its second programming terminal, and for each mCell among the lower-stack mCells that receives a logical input signal at its second programming terminal, there exists a corresponding complimentary mCell among the upper-stack mCells that receives the same logical input signal at its first programming terminal.

15. The complimentary magnetic logic circuit of claim 14, wherein each mCell programming input that does not receive a logical input signal is connected to an input reference terminal that provides a reference voltage.

16. The complimentary magnetic logic circuit of claim 15, wherein the input reference terminal provides a reference voltage approximately midway between the highest voltage regularly seen at the positive supply terminal and the lowest voltage regularly seen at the negative supply terminal.

17. The complimentary magnetic logic circuit of claim 14, wherein each mCell programming input that does not receive a logical input signal is connected to the negative or positive supply terminal.

18. The complimentary logic circuit of claim 8, wherein:
all of said logic input terminals are differential input terminals, each receiving a respective differential logical input signal;
said logic output terminal is a differential terminal that delivers a differential logical output signal, said plurality of magnetic switching cells driving a first node of said differential logic output terminal;
and wherein said complimentary logic circuit further compromises:
a second plurality of mCells, equal in number to said plurality of magnetic switching cells, said second plurality of mCells allocated equally into respective sets of second lower-stack mCells and second upper-stack mCells;
said second lower-stack mCells having their evaluation terminals connected between said negative supply terminal and a second node of said differential logic output terminal in the same configuration as said lower-stack mCells, said second lower-stack mCells receiving the same logical input signals as said lower-stack mCells, but with input polarities reversed;
said second upper-stack mCells having their evaluation terminals connected between said positive supply terminal and the second node of said differential logic output terminal in the same configuration as said upper-stack mCells, said second upper-stack mCells receiving the same logical input signals as said upper-stack mCells, but with input polarities reversed;

whereby:
(i) when said lower-stack mCells enable low-resistance path(s) between said first node of said differential logic output terminal and said negative supply terminal, said second lower-stack mCells disable any low-resistance path(s) between said second node of said differential logic output terminal and said negative supply terminal;
(ii) when said lower-stack mCells disable any low-resistance path(s) between said first node of said differential logic output terminal and said negative supply terminal, said second lower-stack mCells enable low-resistance path(s) between said second node of said differential logic output terminal and said negative supply terminal;
(iii) when said upper-stack mCells enable low-resistance path(s) between said first node of said differential logic output terminal and said positive supply terminal, said second upper-stack mCells disable any low-resistance path(s) between said second node of said differential logic output terminal and said positive supply terminal; and,
(iv) when said upper-stack mCells disable any low-resistance path(s) between said first node of said differential logic output terminal and said positive supply terminal, said second upper-stack mCells enable low-resistance path(s) between said second node of said differential logic output terminal and said positive supply terminal.

19. The logic circuit of claim 18, further comprising:
at least two fanout-receiving logic circuits, each of said fanout-receiving logic circuits comprising plural mCells, at least one of which receives said differential logic output signal at its first and second programming terminals.

20. The logic circuit of claim 19, wherein at least one of the fanout-receiving logic circuits is of complimentary (active load) configuration.

21. The logic circuit of claim 19, wherein at least one of the fanout-receiving logic circuits is of non-complimentary (passive load) configuration.

22. A logic circuit comprising:
at least first, second, third and fourth magnetic switching cells (mCells), each mCell comprising:
first and second programming terminals connected to respective ends of a low-resistance programming path; and
first and second evaluation terminals connected to respective ends of an evaluation path whose resistance can switch between at least a first, lower-resistance state and a second, higher-resistance state in response to signals magnetically coupled from said programming path;
said first mCell receiving a first differential logic signal at its first and second programming terminals, respectively;
said second mCell receiving, in inverted polarity, said first differential logic signal at its second and first programming terminals, respectively;
said third mCell receiving a second differential logic signal at its first and second programming terminals, respectively;
said fourth mCell receiving, in inverted polarity, said second differential logic signal at its second and first programming terminals, respectively;
a differential output terminal having positive and negative output nodes;
said first and third mCells having their respective evaluation terminals connected such that, under a first set of input conditions, the evaluation path(s) of said mCell(s) enable low-resistance path(s) between a supply node and the positive node of the differential output terminal;
said second and fourth mCells having their respective evaluation terminals connected such that, under a second set of input conditions, the evaluation path(s) of said mCell(s) enable low-resistance path(s) between said supply node and the negative node of the differential output terminal;
whereby under the first set of input conditions, low-resistance path(s) exist between the supply node and the positive node of the differential output terminal, but not the negative node of the differential output terminal, and under the second set of input conditions, low-resistance path(s) exist between the supply node and the negative node of the differential output terminal, but not the positive node of the differential output terminal.

23. The logic circuit of claim 22, further comprising:
a first passive load element connected between the positive node of the differential output terminal and a second supply terminal; and,
a second passive load element connected between the negative node of the differential output terminal and the second supply terminal.

24. The logic circuit of claim 22, further comprising:
a first active load circuit, including plural mCells, connected between the positive node of the differential output terminal and a second supply terminal; and,
a second active load circuit, including plural mCells, connected between the negative node of the differential output terminal and the second supply terminal.

25. The logic circuit of claim 22, further comprising:
at least one fanout-receiving gate, said fanout-receiving gate comprised of plural mCells, at least one of which has its programming terminals connected to the positive and negative nodes of the differential output terminal.

26. The logic circuit of claim 25, wherein said at least one fanout-receiving gate provides a differential output.

27. The logic circuit of claim 25, wherein said at least one fanout-receiving gate provides a single-ended output.

28. The logic circuit of claim 22, wherein the circuit implements a NAND2 gate.

29. The logic circuit of claim 22, wherein the circuit implements an AND2 gate.

30. The logic circuit of claim 22, wherein the circuit implements a NOR2 gate.

31. The logic circuit of claim 22, wherein the circuit implements an OR2 gate.

* * * * *